(12) United States Patent
Srinivasan

(10) Patent No.: US 6,430,074 B1
(45) Date of Patent: Aug. 6, 2002

(54) SELECTIVE LOOK-AHEAD MATCH LINE PRE-CHARGING IN A PARTITIONED CONTENT ADDRESSABLE MEMORY ARRAY

(75) Inventor: Varadarajan Srinivasan, Los Altos Hills, CA (US)

(73) Assignee: Netlogic Mircosystems, Inc., Mountain View, CA (US)

( * ) Notice: Subject to any disclaimer, the term of this patent is extended or adjusted under 35 U.S.C. 154(b) by 0 days.

(21) Appl. No.: 09/813,900

(22) Filed: Mar. 20, 2001

Related U.S. Application Data

(63) Continuation-in-part of application No. 09/391,989, filed on Sep. 9, 1999, now Pat. No. 6,243,280.

(51) Int. Cl.[7] .............................................. G11C 15/00
(52) U.S. Cl. ......................................... 365/49; 365/203
(58) Field of Search ...................... 365/49, 203, 230.03

(56) References Cited

U.S. PATENT DOCUMENTS

| 5,299,147 A | * | 3/1994 | Holst | 365/49 |
|---|---|---|---|---|
| 5,483,480 A | | 1/1996 | Yoneda | 365/49 |
| 5,517,441 A | | 5/1996 | Dietz et al. | 365/49 |
| 5,659,697 A | | 8/1997 | Dietz | 395/417 |
| 5,987,246 A | | 11/1999 | Shindo | 365/49 |

* cited by examiner

Primary Examiner—Vu A. Le

(57) ABSTRACT

A selective look-ahead pre-charging technique is used in a CAM having a plurality of row segments that allows pre-charging operations in a row segment to be overlapped with compare operations in one or more preceding row segments. In one embodiment, each row includes four row segments each having a plurality of CAM cells coupled to a corresponding match line segment. The first and second match line segments are pre-charged to enable detection of match conditions therein. The third match line segment is selectively pre-charged in response to match conditions in the first row segment, and the fourth match line segment is selectively pre-charged in response to match conditions in the second row segment. If there are match conditions in all row segments, a match condition is indicated for the row. If there is a mismatch condition in any row segment, a mismatch condition is indicated.

26 Claims, 14 Drawing Sheets

SELECTIVE LOOK-AHEAD MATCH LINE PRE-CHARGING IN A PARTITIONED CONTENT ADDRESSABLE MEMORY ARRAY

CROSS-REFERENCE TO RELATED APPLICATION

This application is a continuation-in-part of, and claims the benefit under Title 35, United States Code, Section 120, of commonly owned and U.S. patent application Ser. No. 09/391,989 now U.S. Pat. No. 6,243,280, filed Sep. 9, 1999, entitled "SELECTIVE MATCH LINE CHARGING IN A PARTITIONED CONTENT ADDRESSABLE MEMORY ARRAY," incorporated by reference herein.

BACKGROUND

1. Field of Invention

This invention relates generally to semiconductor memories and specifically to content addressable memories.

2. Description of Related Art

A CAM includes an array of memory cells arranged in a matrix of rows and columns. Each memory cell stores a single bit of digital information, i.e., either logic zero or logic one. The bits stored within a row of memory cells constitute a CAM word. During compare operations, a comparand word is received at appropriate input terminals of the CAM and then compared with all the CAM words. For each CAM word that matches the comparand word, a corresponding match line signal is asserted to indicate a match condition. When there is a match condition, the index or address of the matching CAM word is read from the CAM. Associative information stored in, for instance, an associated RAM, may also be provided.

FIG. 1 shows a typical CAM row 1 as having n CAM cells 10(1)–10(n) each coupled to an associated match line ML. A pull-up transistor 12, coupled between a supply voltage $V_{DD}$ and match line ML, has a gate tied to ground potential, and therefore remains in a conductive state. Prior to each compare operation between an n-bit comparand word and an n-bit CAM word stored in CAM cells 10(1)–10(n), match line ML is pre-charged to supply voltage $V_{DD}$ via pull-up transistor 12. The n-bits of the comparand word are compared with corresponding bits of the CAM word in respective CAM cells 10(1)–10(n). If all bits of the comparand word match corresponding bits of the CAM word, the match line ML remains charged to indicate a match condition. Conversely, if one of the comparand bits does not match the corresponding CAM bit, the CAM cell 10 storing that CAM bit discharges match line ML toward ground potential to indicate a mismatch condition.

As described above, the match lines in a CAM array are typically pre-charged to the supply voltage $V_{DD}$ for each and every compare operation. Thus, for each mismatch condition, an associated match line ML is first charged toward $V_{DD}$ and then discharged toward ground potential. Current flow associated with this charging and discharging results in undesirable power consumption. Further, as the number of CAM cells in each row of a CAM array increases, capacitive loading on the match lines increases accordingly. As loading on the match lines increases, the current required to charge the match lines toward the supply voltage increases. Accordingly, as CAM words are widened, for example, to accommodate longer Internet addresses, power consumption resulting from charging the match lines during compare operations may significantly increase. Therefore, as CAM words become wider, it is desirable to reduce power consumption during compare operations.

SUMMARY

A method and apparatus are disclosed that may reduce power consumption in a CAM during compare operations. In accordance with one embodiment the present invention, rows of the CAM array are partitioned into a plurality of row segments, with each row segment having a corresponding match line segment. A first match line segment is pre-charged to enable detection of match conditions in the associated first row segment. Subsequent match line segments are then selectively pre-charged in response to the match conditions in the preceding row segments.

In one embodiment, rows of a CAM array are partitioned into first and second row segments. A first match line segment is pre-charged to enable detection of match conditions within the associated first row segment. If there is a match condition in the first row segment, a second match line segment is pre-charged to enable detection of match conditions in the associated second row segment. If there is also a match condition in the second row segment, a match condition is indicated for the row. A mismatch condition in the second row segment indicates a mismatch condition for the row. Conversely, if there is a mismatch condition in the first row segment, the second match line segment is not pre-charged, thereby disabling the second match line segment. In this manner, a mismatch condition may be indicated for the row without pre-charging the second match line segment. In this case, where only the first match line segment is pre-charged during the compare operation, power consumption associated with pre-charging the second match line segment is saved. Accordingly, where the first and second row segments include equal numbers of CAM cells, and thus the first and second match line segments are approximately equally loaded by the CAM cells, present embodiments may achieve power savings of up to 50% during such pre-charge operations. Since power savings is proportional to the number CAM cells per row that are enabled during each compare operation, higher power savings may be achieved by increasing the number of row segments, or by having different numbers of CAM cells in each row segment.

In other embodiments, the match line segments in first and second row segments are pre-charged to enable detection of match conditions therein. The match line segments in one or more subsequent odd row segments are selectively pre-charged in response to match conditions in the first row segment, and the match line segments in one or more subsequent even row segments are selectively pre-charged in response to match conditions in the second row segment. Thereafter, match conditions in each subsequent row segment may be used to selectively pre-charge one or more additional row segments.

In an exemplary embodiment, each row includes four row segments of CAM cells. The match line segments in the first and second row segments are pre-charged to enable detection of match conditions therein. If there is a match condition in the first row segment, the match line segment in the third row segment is pre-charged to enable detection of match conditions therein. Similarly, if there is a match condition in the second row segment, the match line segment in the fourth row segment is pre-charged to enable detection of match conditions therein. If there are also match conditions in the third and fourth second row segments, a match condition is indicated for the row. In this manner, the pre-charging of the third match line segment may be overlapped with compare operations in the second row segment so that compare operations in the third row segment may be commenced almost immediately after compare operations in the second row segment, i.e., without incurring delays associated with pre-charging the third match line segment. Similarly, the pre-charging of the fourth match line segment may be overlapped with compare operations in the third row segment so that compare operations in the fourth row segment may be commenced almost immediately after compare operations in the third row segment, i.e., without incurring delays associated with pre-charging the fourth match line segment. In this manner, compare operations for the row may be more efficiently executed to improve performance.

Conversely, if there is a mismatch condition in the first row segment, the third match line segment is not pre-charged, thereby disabling the third match line segment. If there is a mismatch condition in the second row segment, the fourth match line segment is not pre-charged, thereby disabling the fourth match line segment. In one embodiment, the fourth match line segment is not pre-charged if there is a mismatch condition in either the first or second row segments. A mismatch condition in any of the row segments causes a mismatch condition for the row. In this manner, a mismatch condition may be indicated for the row without pre-charging all match line segments, thereby reducing power consumption associated with pre-charging match line segments.

BRIEF DESCRIPTION OF THE DRAWINGS

Like reference numerals refer to corresponding parts throughout the drawing figures.

DETAILED DESCRIPTION

Embodiments of the present invention are discussed below in the context of a CAM architecture 20 for simplicity only. It is to be understood that embodiments of the present invention are equally applicable to CAM structures of other sizes and configurations, as well as to other types of memory devices such as, for instance, RAM, Flash, and EEPROM. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Figure 2:
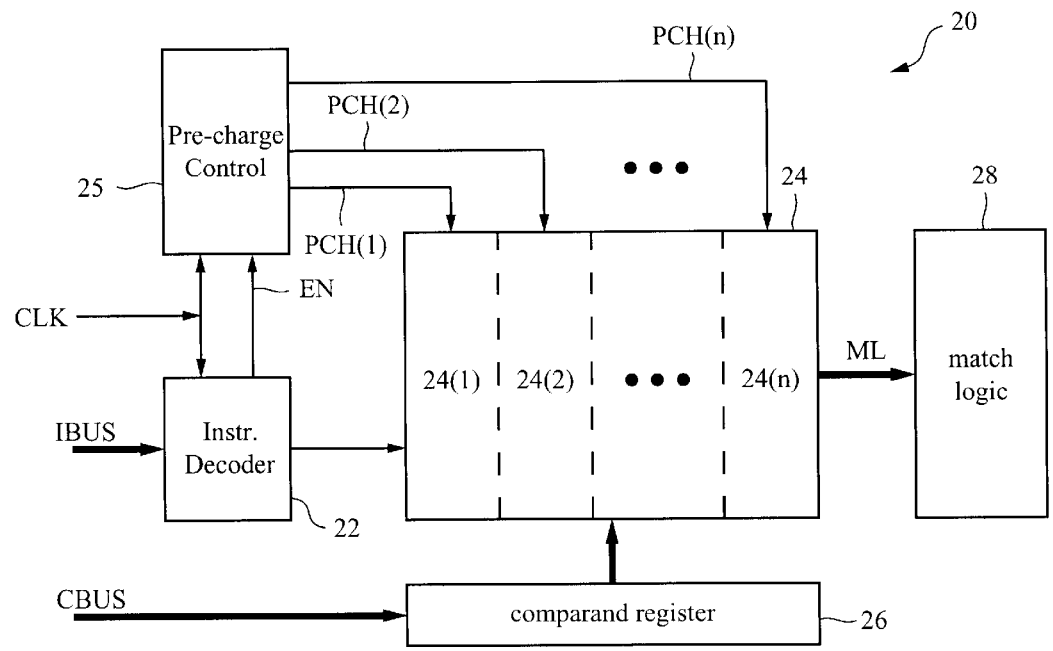
FIG. 2 is a block diagram of a CAM architecture in accordance with one embodiment of the present invention.

FIG. 2 shows a CAM architecture 20 in accordance with the present invention including an instruction decoder 22, a CAM array 24, a comparand register 26, a pre-charge control circuit 25, and match logic 28. Instruction decoder 22 decodes instructions received from an instruction bus IBUS and, in response thereto, provides control signals to CAM array 24 (e.g., write and/or read circuitry not shown). CAM architecture 20 may be a synchronous architecture that loads instructions into instruction decoder 22 in response to a clock signal CLK. For other embodiments, CAM architecture 20 may be asynchronous. A comparand word to be compared with data words stored in corresponding rows of CAM array 24 is received on a comparand bus CBUS and thereafter provided directly to CAM array 24, or provided to CAM array 24 via the comparand register 26. For compare operations, one or more bits of the comparand word may be globally masked by mask data stored in one or more registers (not shown), or locally masked. During compare operations, each row of CAM array 24 provides a match signal to match logic 28 via match lines ML to indicate whether a match condition exists for the row. Match logic 28 may output one or more flag signals including a single match flag, a multiple match flag, and/or a full flag signal. The match lines may also be provided to an encoder such as a priority encoder.

CAM array 24 includes a plurality of CAM cells arranged in rows and columns. In accordance with the present invention, the rows of CAM array 24 are divided into a plurality of row segments 24(1)–24(n), each including any suitable number of CAM cells. In some embodiments, the row segments each include the same number of CAM cells, while in other embodiments the row segments include different numbers of CAM cells. CAM array 24 includes any type of CAM cells, including any type of binary or ternary CAM cells.

Each row segment 24(1)–24(n) includes an associated match line segment to which the CAM cells therein are connected (for simplicity, match line segments are not shown in FIG. 2). Each match line segment may be selectively pre-charged in response to one of pre-charge signals PCH(1)–PCH(n), respectively. The pre-charge signals PCH are generated by pre-charge control circuit 25 when instruction decoder 22 determines that a compare instruction is provided on IBUS (as indicated by the enable signal EN). Pre-charge control circuit 25 may be any clock buffer, a one-shot circuit (with multiple time-delayed outputs), a phase-locked loop (PLL), or delay-locked loop (DLL). The pre-charge signals PCH may be pulses, clocks, or other signals.

During compare operations, a comparand word provided to comparand register 26 is compared with CAM words stored in corresponding rows of CAM array 24. One or more first match line segments of CAM array 24 are pre-charged by one or more of the pre-charge signals PCH toward a supply voltage $V_{DD}$ (or another predetermined voltage level), while all other match line segments remain uncharged (or, alternately, are discharged). If there is a match condition within the one or more first row segments, one or more second match line segments are pre-charged toward $V_{DD}$ by corresponding pre-charge signals PCH to enable detection of match conditions in the one or more second row segments. Sequential pre-charging of subsequent match line segments in response to match conditions in preceding row segments continues until either (1) all row segments indicate match conditions, in which case a match condition exists for the row, or (2) a mismatch condition is detected, in which case subsequent match line segments are not pre-charged and a mismatch condition is indicated for the row. By sequentially pre-charging match line segments of CAM array 24 in response to match conditions in preceding row segments, present embodiments may significantly reduce power consumption associated with pre-charging match lines during compare operations.

Figure 3:
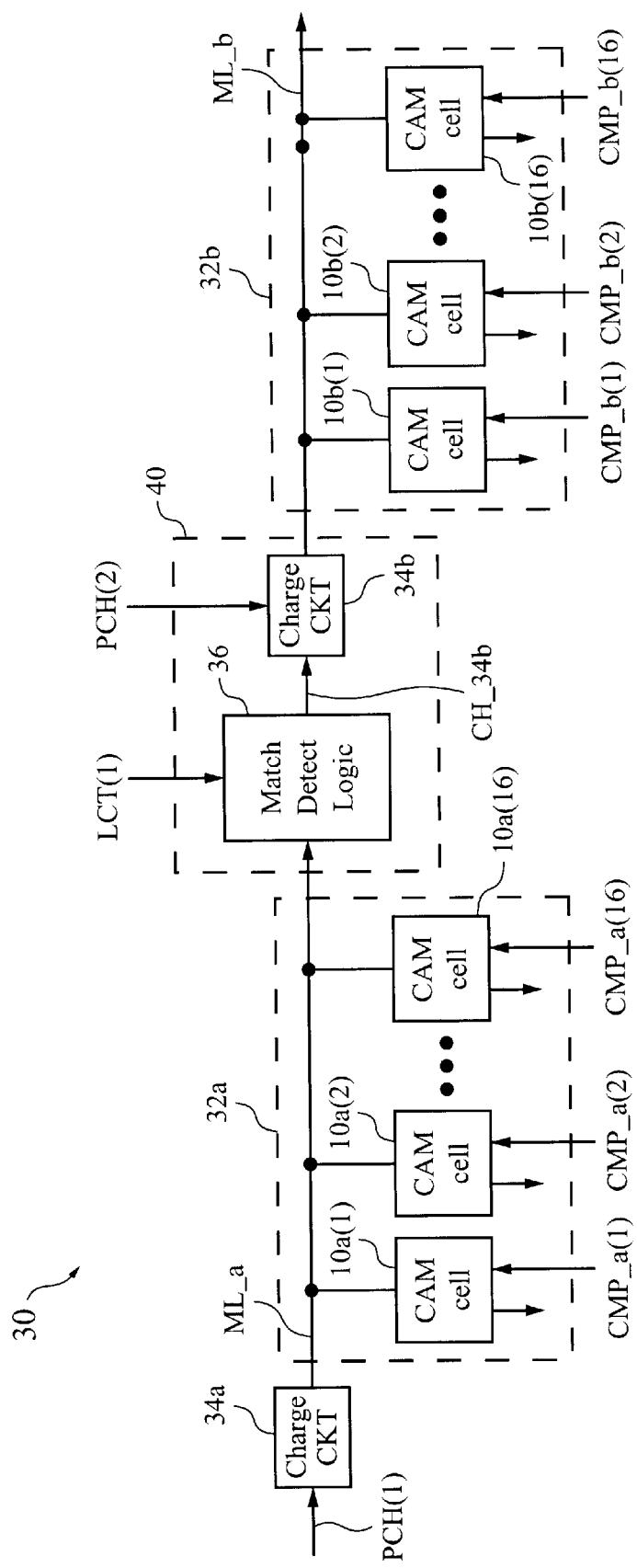
FIG. 3 is a block diagram of a row of the CAM architecture of FIG. 2 in accordance with one embodiment of the present invention.

FIG. 3 shows a 32-bit row 30 in accordance with one embodiment of CAM architecture 20. Row 30 includes two row segments 32a and 32b. Row segment 32a includes sixteen CAM cells 10a(1)–10a(16) each coupled to associated first match line segment ML_a and each receiving one bit of comparand data CMP_a(1)–CMP_a(16), respectively. Second row segment 32b includes sixteen CAM cells 10b(1)–10b(16) each coupled to associated second match line segment ML_b and each receiving one bit of comparand data CMP_b(1)–CMP_b(16), respectively. Word line(s) and bit line(s) have been omitted from FIG. 3 for simplicity. A first charge circuit 34a pre-charges first match line segment ML_a in response to the logic state of pre-charge signal PCH(1). The logic state of first match line segment ML_a, which indicates the match condition of first row segment 32a, is monitored by match detect logic 36. Match detect logic 36 outputs charge signal CH_34b in response to the logic state of first match line segment ML_a and control signal LCT(1). Match detect logic 36 outputs CH_34b to a second charge circuit 34b. Charge circuit 34b pre-charges second match line segment ML_b in response to PCH(2) if CH_34b indicates a match condition for first row segment 32a. Together, match detect logic 36 and charge circuit 34b form a match line control circuit 40 that selectively pre-charges second match line segment ML_b in response to match conditions in first row segment 32a.

In some embodiments, match detect logic 36 includes AND logic that drives CH_34b to logic high in response to ML_a being logic high and LCT(1) being logic high. Charge circuit 34b then pre-charges ML_b when CH_34b is logic high and PCH(2) is asserted. Match detect logic 36 may include one or more other logic gates. In other embodiments, match detect logic 36 includes a well-known latch, and LCT(1) latches the logic state of first match line segment ML_a to generate CH_34b. For still another embodiment, match detect logic 36 may be a voltage level shifter (e.g., a logic gate) that adjusts the voltage level on ML_a to appropriate logic levels for charge circuit 34b. For yet another embodiment, match detect logic 36 may be omitted and ML_a provided to charge circuit 34b as CH_34b.

In one embodiment, logic similar to match detect logic 36 is provided between PCH(1) and first charge circuit 34a, and may also receive an enable signal from instruction decoder 22. In this embodiment, first match line segment ML_a is pre-charged in response to this enable signal and PCH(1). In some embodiments, signal CH_34b may also be provided by instruction decoder 22 to pre-charge all row segments during compare operations, thereby allowing match conditions within all row segments to be evaluated simultaneously.

Figure 4:
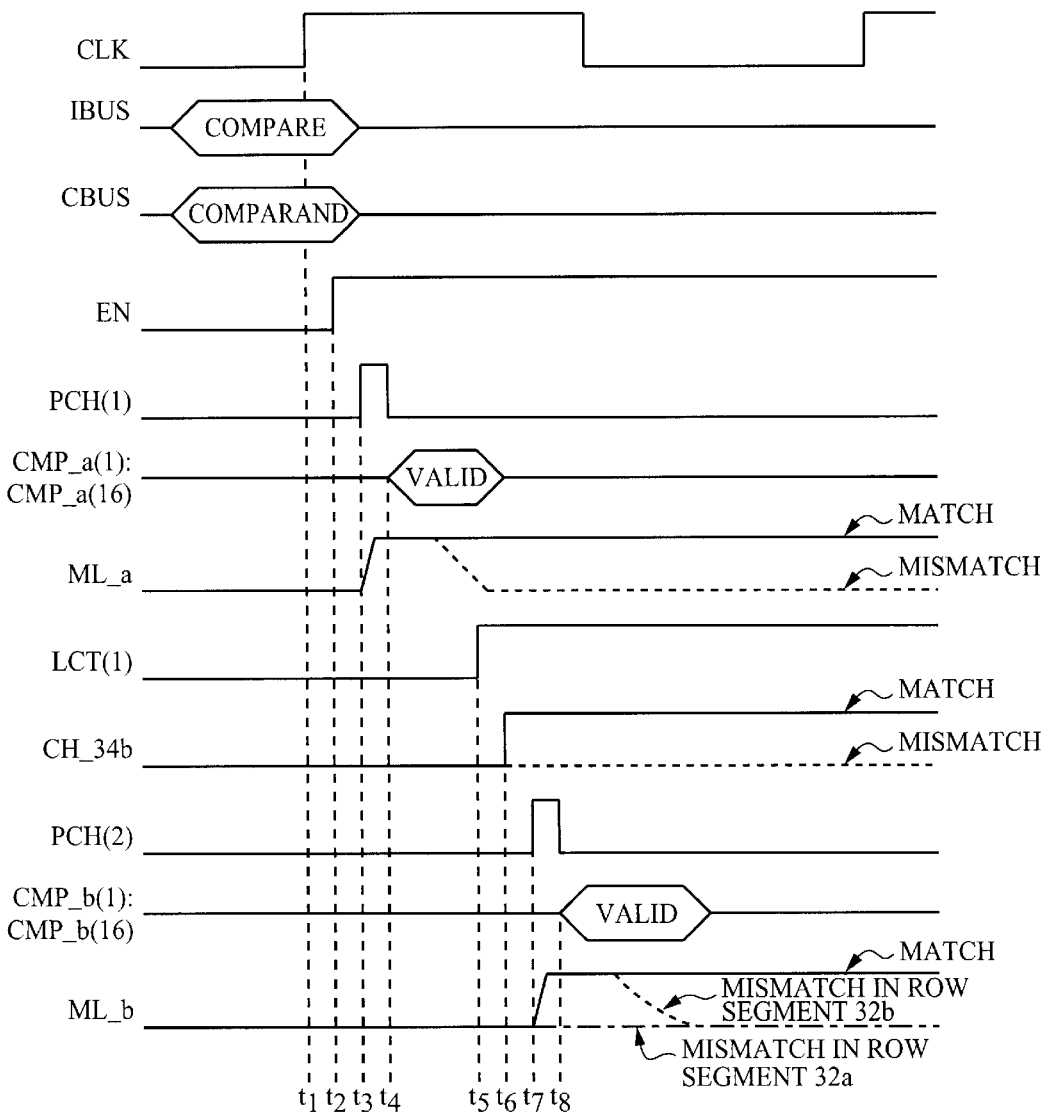
FIG. 4 is a timing diagram illustrating one embodiment of a compare operation of the CAM of FIG. 3.

FIG. 4 shows one example of a timing diagram illustrating a compare operation between a 32-bit comparand word and a 32-bit CAM word stored in row 30. For this embodiment, the pre-charge signals PCH(1) and PCH(2) are pulse signals. At time $t_1$, a compare instruction is provided to and subsequently decoded by instruction decoder 22. In response thereto, instruction decoder 22 asserts EN at time $t_2$, and causes pre-charge control circuit 25 to assert PCH(1) at time $t_3$. PCH(1) causes charge circuit 34a to charge first match line segment ML_a high toward $V_{DD}$ to enable detection of match conditions in first row segment 32a. The comparand bits CMP_a(1)–CMP_a(16) are then compared with data stored in CAM cells 10a(1)–10a(16) within first row segment 32a. CMP_a(1)–CMP_a(16) may be provided at time $t_4$. When there is a match, first match line segment ML_a remains pre-charged to a high logic state. If there is a mismatch, then the CAM cell(s) storing the mismatching data pulls ML_a toward a low logic state.

At time $t_5$, LCT(1) is asserted to latch or determine the logic state of CH_34b. At time $t_6$, PCH(2) is asserted by pre-charge control circuit 25. When ML_a is logic high and match detect logic 36 generates a logic high signal CH_34b, second charge circuit 34b pre-charges second match line segment ML_b toward $V_{DD}$ in response to PCH(2) at time $t_7$. CMP_b(1)–CMP_b(16) are provided to second row segment32b at time $t_8$. For another embodiment, CMP_b(1)–CMP_b(16) may be provided to the CAM row together with CMP_a(1)–CMP_a(16) at time $t_4$. If all bit comparisons between CMP_b(1)–CMP_b(16) and CAM cells 10b(1)–10b(16) within second row segment 32b match, second match line segment ML_b remains in a logic high state to indicate a match condition for second row segment 32b. Here, there is a match condition for the row. Otherwise, if any of the bit comparisons in the second row segment 32b mismatch, corresponding CAM cell(s) within second row segment 32b pull second match line segment ML_b low toward ground potential to indicate a mismatch condition for the row segment and the row.

On the other hand, if any of the bit comparisons in first row segment 32a mismatch, corresponding CAM cell(s) within first row segment 32a pull first match line segment ML_a low toward ground potential to indicate a mismatch condition. In response to the mismatch condition in first row segment 32a, as indicated by the discharged state of first match line segment ML_a, match detect logic 36 maintains signal CH_34b in a logic low state, as indicated by the dashed line in FIG. 4. In response thereto, second charge circuit 34b does not pre-charge second match line segment ML_b toward $V_{DD}$. Charge circuit 34b may maintain ML_b in a discharged state. Thus, in accordance with the present invention, mismatch conditions in preceding row segment 32a force a mismatch condition for subsequent row segment 32b without pre-charging the subsequent match line segment ML_b. In this case, where only the first match line segment is pre-charged during the compare operation, power consumption associated with pre-charging the second match line segment is saved. Thus, by sequentially pre-charging match line segments in response to match conditions in preceding row segments, present embodiments may reduce power consumption during compare operations.

Power savings realized by present embodiments are proportional to the number of row segments in the CAM array, as well as to the percentage of mismatch conditions in the first row segments. For instance, where each CAM row is partitioned into two segments having equal numbers of CAM cells as shown in FIG. 3, power consumption resulting from the pre-charging of match lines during compare operations may be reduced, for example, by approximately 50%. When employed in applications where compare operations typically result in mismatch conditions, and in particular where the second and all subsequent match line segments are not usually pre-charged, present embodiments may achieve significant power savings.

Figure 5:
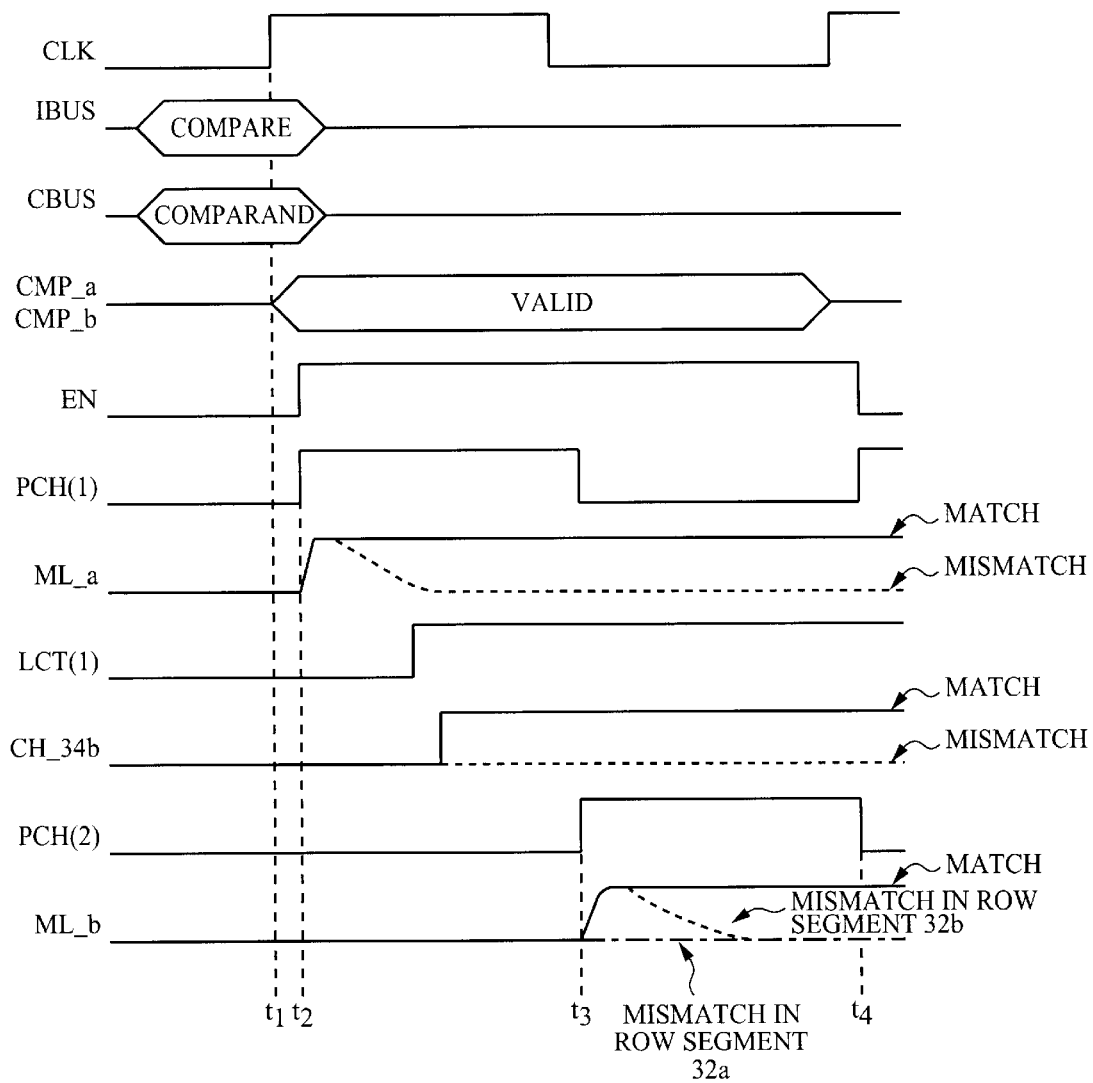
FIG. 5 is a timing diagram illustrating another embodiment of a compare operation of the CAM of FIG. 3.

FIG. 5 shows another example of a timing diagram illustrating a compare operation for row 30. For this embodiment, pre-charge signals PCH(1)–PCH(n) are periodic or clock signals, and the comparand data is provided to row 30 throughout performance of the compare operation. This embodiment may alternately have comparand data CMP_a(1)–CMP_a(16) provided at a different time from CMP_b(1)–CMP_b(16) in FIG. 4. The compare operation of FIG. 5 operates in the same fashion as that of FIG. 4, except that PCH(1) and PCH(2) are clock signals. PCH(1) is asserted at time $t_2$, and oscillates at approximately the same frequency as CLK. PCH(2) is subsequently asserted at time $t_3$, and is thereafter approximately 180 degrees out of phase with PCH(1) for the duration of the instruction. If a third row segment is included in row 30, then it would receive PCH(3) which would be asserted at time $t_4$ and thereafter be approximately 180 degrees out of phase with respect to PCH(2). The periodic pre-charge signals can alternately have any phase relationship with each other so long as each signal is not initially asserted until the preceding row segment has resolved the state of its corresponding match line segment.

Figure 6:
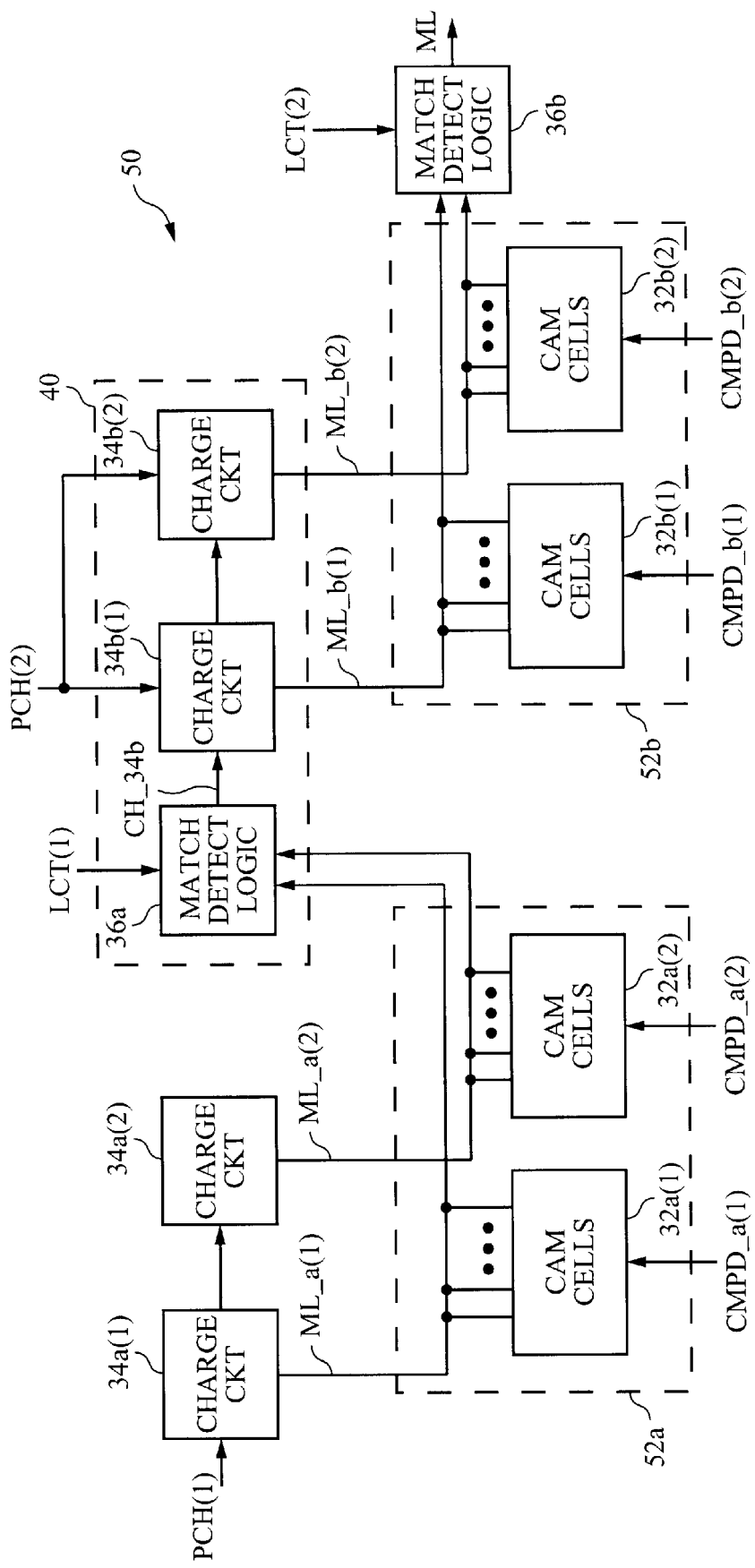
FIG. 6 is a block diagram of one embodiment of a row of the CAM architecture of FIG. 2.

FIG. 6 shows a row 50 in accordance with another embodiment of CAM architecture 20. Row 50 includes two composite row segments 52a and 52b each including two (or more) of the 16-bit row segments 32 of FIG. 3. First composite row segment 52a includes 16-bit row segments 32a(1) and 32a(2), and second composite row segment 52b includes 16-bit row segments 32b(1) and 32b(2). Row segments 32a(1), 32a(2), 32b(1), and 32b(2) are coupled to associated match line segments ML_a(1), ML_a(2), ML_b(1), and ML_b(2), respectively. Charge circuits 34a(1) and 34a(2) charge match line segments ML_a(1) and ML_a(2) of first and second row segments 32a(1) and 32a(2), respectively, high toward $V_{DD}$ in response to PCH(1) to enable detection of match conditions within first composite row segment 52a. Match conditions within row segments 32a(1) and 32a(2) of first composite row segment 52a are provided to match detect logic 36a via match line segments ML_a(1) and ML_a(2), respectively. Match detect logic 36a logically combines the logic states of match line segments ML_a(1) and ML_a(2) to generate CH_34b for charge circuits 34b(1) and 34b(2). For one embodiment, match detect logic 36a is an AND or NAND gate. Logic 36a may also include a latch that latches the logical combination of the match line segments ML_a(1) and ML_a(2) in response to LCT(1).

If there are match conditions within both row segments 32a(1) and 32a(2) of first composite row segment 52a, match detect logic 36a asserts CH_34b such that charge circuits 34b(1) and 34b(2) pre-charge match line segments ML_b(1) and ML_b(2), respectively, when PCH(2) is asserted. Match conditions within row segments 32b(1) and 32b(2) of second composite row segment 52b are then provided to match detect logic 36b via match line segments ML_b(1) and ML_b(2), respectively. In response thereto, match detect logic 36b logically combines the logic states of the match line segments ML_b(1) and ML_b(2) to provide a match signal for row 50 on match line ML. Thus, if there are match conditions in segments 32b(1) and 32b(2) of second composite row segment 52b, match detect logic 36b drives the match line ML high to indicate a match condition for row 50.

If there is a mismatch condition within either of composite row segments 52a or 52b, match detect logic 36b forces match line ML low to indicate a mismatch condition for the row. For example, if first composite row segment 52a has a mismatch, CH_34b is not asserted and charge circuits 34b(1) and 34b(2) discharge match line segments ML_b(1) and ML_b(2), respectively. Also, if a mismatch condition is detected in second composite row segment 52b, one or both of match line segments ML_b(1) and/or ML_b(2) is discharged. When either ML_b(1) or ML_b(2) is discharged, match detect logic 36b does not assert ML.

Any number of composite row segments may be used, with each having a corresponding match control circuit 40. If at any point in the sequential evaluation of match conditions in successive row segments there is a mismatch condition, the corresponding match line segment is discharged toward ground potential and, in response thereto, all subsequent match line segments remain uncharged (e.g., are discharged toward ground potential). In this manner, the mismatch condition propagates through subsequent row segments without enabling subsequent match line segments. Thus, if a mismatch condition is detected in the first of the four row segments, only one of the four corresponding match line segments for each row is pre-charged toward $V_{DD}$. Since the next match line segments are not charged, power consumption associated with charging those match line segments is saved. For example, power consumption associated with match line pre-charging during a compare operation may be reduced by approximately 75% when a mismatch condition is detected in the first composite row segment of a row having 4 total composite row segments. In a similar manner, for compare operations which result in detection of a mismatch condition in the second of the four row segments, the reduction in power consumption during the compare operation may be approximately 50%. Further, for compare operations which result in detection of a mismatch condition in the third of the four row segments, the reduction in power consumption during the compare operation may be approximately 25%.

Present embodiments may also be effective in applications where the external data bus width is narrower than the CAM array and its internal comparand bus CBUS. In such applications, multiple load operations are required to load a comparand word into a CAM array for compare operations. For example, if an external 32-bit bus is used to provide 128-bit comparand words to a 128-bit wide CAM array, four 32-bit load operations are required to load the 128-bit comparand word into the CAM array. In contrast to prior art CAM architectures, which typically wait until all four load operations are complete before beginning the compare operation, present embodiments may improve performance by overlapping load and compare operations. For example, after a first 32-bit segment of a comparand word is loaded, compare operations may begin on the first 32-bit segment while a second 32-bit segment is loaded. Match conditions within the second 32-bit segment of row 60 may then be evaluated while the third 32-bit segment of the comparand word is loaded, and so on. Accordingly, by executing load and compare operations for such applications in a pipelined fashion, present embodiments may not only reduce power consumption but also achieve performance advantages over prior art structures.

Figure 7:
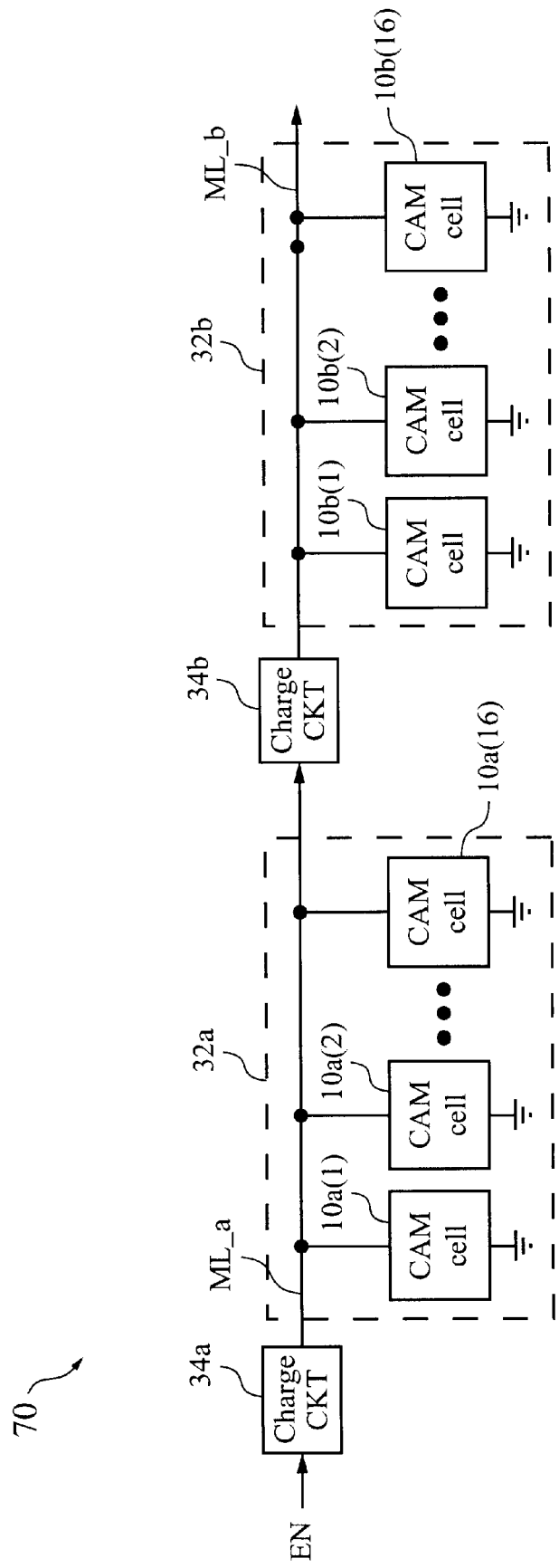
FIG. 7 is a block diagram of another embodiment of a row of the CAM architecture of FIG. 2.

FIG. 7. shows a row 70 in accordance with still another embodiment of the present invention which provides sequential, asynchronous compare operations. Here, pre-charge signals PCH(1)–PCH(n) are omitted to provide an asynchronous CAM structure. Enable signal EN, which as mentioned above may be provided by instruction decoder 22, is provided directly to charge circuit 34a to pre-charge match line segment ML_a of first row segment 32a. Match line segment ML_a is connected to second charge circuit 34b. Thus, second match line segment ML_b is pre-charged to enable detection of match conditions within second row segment 32b only in response to the logic state of first match line match segment ML_a.

Figure 8:
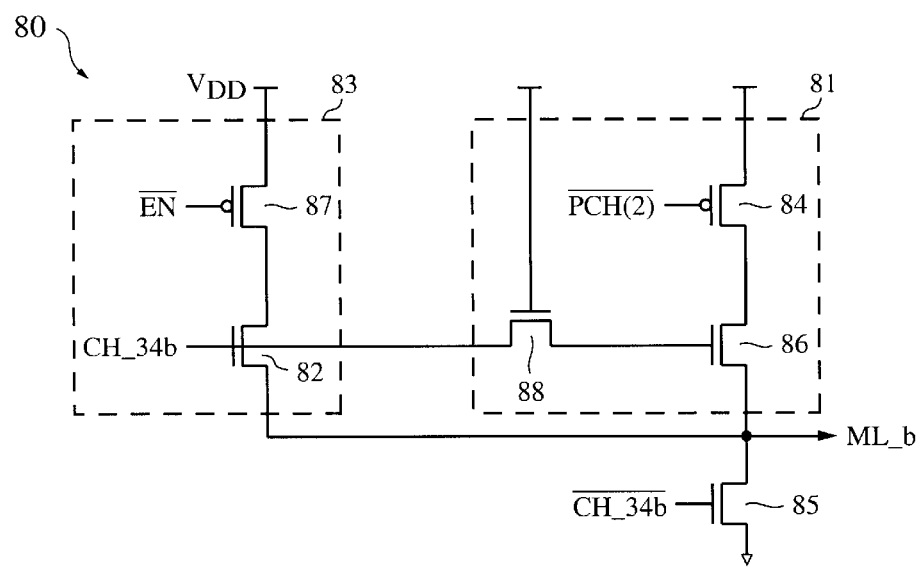
FIG. 8 is a circuit diagram of the charge circuit of FIG. 3 in accordance with one embodiment.

FIG. 8 shows a charge circuit 80 that is one embodiment of the charge circuit 34b of FIG. 3. Other embodiments may be used. Charge circuit 80 includes an AC pre-charge circuit 81, a DC pre-charge circuit 83, and a discharge transistor 85. DC pre-charge circuit 83 is a weak pre-charge circuit that maintains the pre-charge logic state on ML_b when the relatively strong AC pre-charge circuit 81 has completed its pre-charge operation (i.e., when PCH(2) is de-asserted). DC pre-charge circuit 83 includes transistors 82 and 87 coupled in series between $V_{DD}$ and ML_b. Transistors 82 and 87 pre-charge ML_b so long as a compare instruction is being performed (i.e., EN logic high), and match detect logic 36 indicates that there is a match condition for a previous row segment (i.e., by asserting CH_34b logic high). Weak PMOS transistor 87 has its gate coupled to $\overline{EN}$, and weak NMOS transistor 82 has its gate coupled to CH_34b. For alternative embodiments, DC pre-charge 83 may be omitted.

AC pre-charge circuit 81 includes transistors 84, 86, and 88, and pre-charges ML_b when the pre-charge signal PCH(2) is asserted. PMOS transistor 84 and NMOS transistor 86 serve as strong pull-up transistors and are connected in series between match line segment ML_b and $V_{DD}$. PMOS transistor 84 has its gate coupled to $\overline{PCH(2)}$. NMOS pass transistor 88 has its gate tied to $V_{DD}$, and passes CH_34b to the gate of NMOS transistor 86. NMOS transistor 88 is optional, and buffers signal CH_34b from the gate of transistor 86. When $\overline{PCH(2)}$ is logic low (PCH(2) logic high) and CH_34b is logic high, transistors 84 and 86 turn on and rapidly charge match line segment ML_b toward $V_{DD}$.

Discharge transistor 85 is included to discharge ML_b when the preceding row segment indicates a mismatch condition or has not yet resolved its match condition. Discharge transistor 85 is an NMOS transistor that has its drain coupled to ML_b, its gate coupled to $\overline{CH\_34b}$, and its source coupled to ground. Other discharge circuits can be used.

When pre-charge circuit 80 is used as charge circuit 34a, the gate of transistor 82 may receive EN, and the gate of discharge transistor 85 may have its gate coupled to $\overline{EN}$.

It is noted that sequential pre-charging of match line segments in response to match conditions evaluated in preceding row segments, as described above with respect to the present invention, does not adversely affect latency delay during compare operations. Conversely, since match line loading is effectively reduced by dividing the match lines into a plurality of segments, thereby reducing RC delays, present embodiments may improve speed during compare operations.

Figure 1:
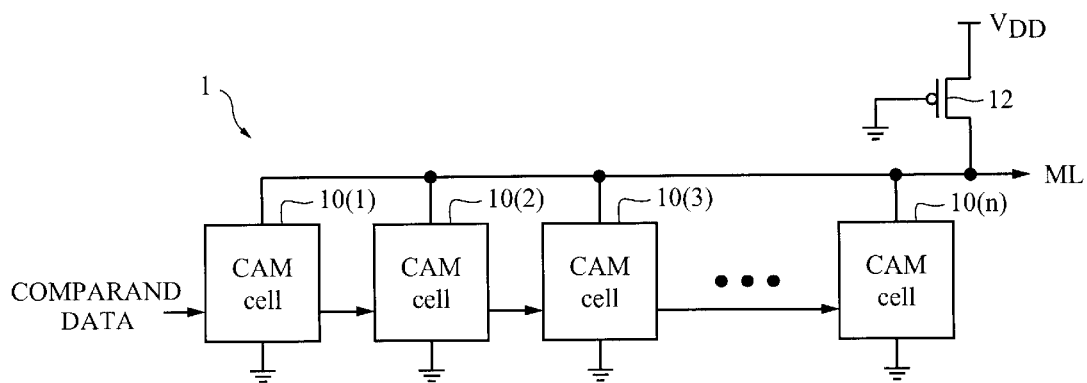
FIG. 1 is a block diagram of a row of a typical CAM array.
Figure 9:
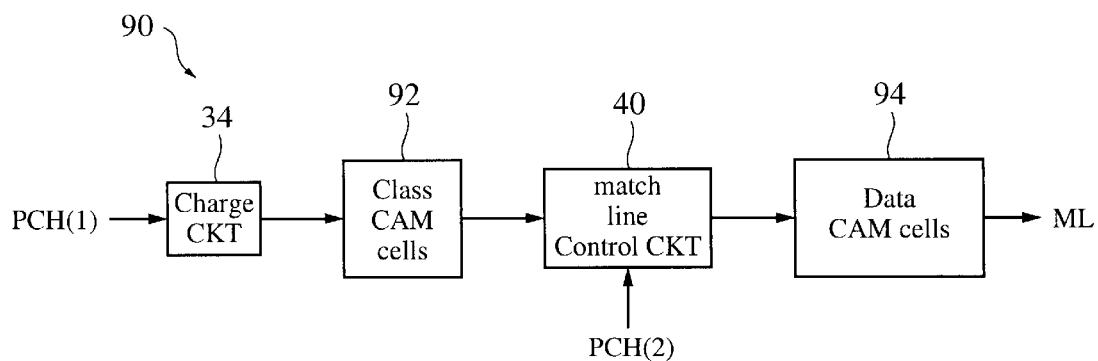
FIG. 9 is a block diagram of a CAM architecture storing class data in one row segment and storing corresponding data in a second row segment in accordance with one embodiment of the present invention.

Sequential search techniques in accordance with present embodiments may be used to implement a class searching function useful, for example, in Internet routing applications. For example, FIG. 9 shows a CAM row 90 that is one embodiment of CAM 20 of FIG. 2 configured to implement a class searching function. Row 90 includes a first row segment 92 having a first number of CAM cells designated as class cells, and a second row segment 94 having a second number of CAM cells designated as data cells. In one embodiment, the class and data cells of FIG. 9 are of the type shown in FIG. 1, although in other embodiments other suitable CAM cells may be used, including ternary CAM cells. Data cells in data segment 94 store data such as Internet addresses, while class cells in class segment 92 store class information which indicates to which class corresponding data belongs. A comparand word containing class and data segments aligned with class and data segments 92 and 94, respectively, is provided to the CAM rows 90 during a compare operation. Match line segments (not shown for simplicity) in class segment 92 are pre-charged toward $V_{DD}$ by charge circuit 34 in response to pre-charge signal PCH(1) in the manner described above with respect to FIGS. 3 and 4.

During compare operations, if class information stored in class segment 92 matches the class segment of the comparand word, match line segments in corresponding data segment 94 are pre-charged toward $V_{DD}$ to enable detection of match conditions in data segment 94. If, on the other hand, there is a mismatch condition in class segment 92, match lines within corresponding data segment 94 are not pre-charged to force a mismatch condition for the row. In this manner, data stored in data cells of data segment 94 may be initially be searched according to class and, if there is a match, then searched according to data. Accordingly, the selective pre-charging of match line segments in data segment 94 not only reduces power consumption during compare operations, but also allows for sequential searching based upon a plurality of pre-defined classes. In this manner, present embodiments may implement a dynamic masking function based upon class matches, e.g., match conditions in preceding row segments.

In one embodiment, class segment 92 of row 90 includes 4 CAM cells, thereby allowing for $2^4=16$ different classes or applications, and data segment 94 includes 32 or 128 CAM cells. For example, data segment 94 may store a 32-bit or 128-bit Internet Protocol (IP) address, while class segment 92 indicates to which of 16 classes the corresponding IP address belongs. The classes may indicate suitable information about the corresponding address such as, for instance, a virtual private network (VPN) identifier or an identifier for protocol-based applications. Here, for example, embodiments of FIG. 9 allow for address entries stored within data segment 94 to be first searched for a class match, and then subsequently searched for an address match. Comparison may be performed in a single clock cycle or in multiple clock cycles. Further, since in this example the match line segments corresponding to only 4 of the CAM cells in row are initially pre-charged for compare operations, and thus the match line segment(s) corresponding to the remaining 32 or 128 CAM cells in row 90 are not pre-charged, power consumption associated with match line pre-charging may be significantly reduced over prior art structures.

Embodiments of FIG. 3 described above may reduce power consumption during compare operations by selectively pre-charging the second match line segment in response to match conditions in the first row segment. However, in embodiments having many row segments, the pre-charging of each match line segment in response to match conditions in the immediately preceding row segment may undesirably lengthen the duration of the compare operation because the pre-charging of each match line segment does not begin until after compare operations are completed in all preceding row segments. For synchronous embodiments, this may limit the maximum operating frequency for compare operations.

Figure 10A:
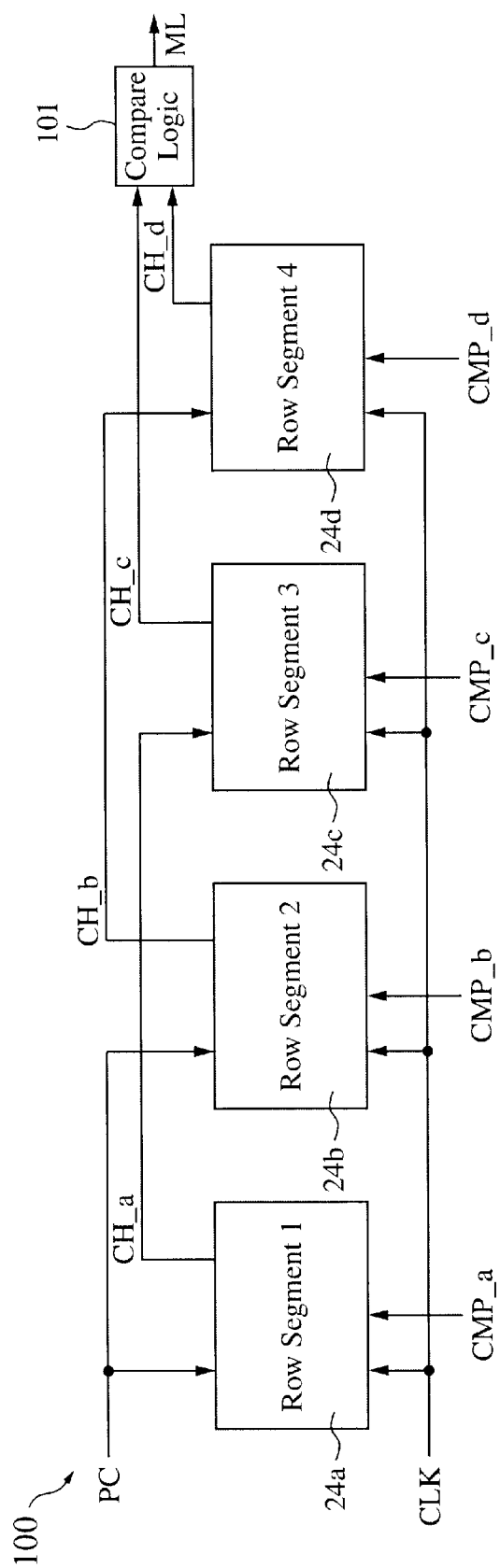
FIG. 10A is a block diagram of a row of the CAM architecture of FIG. 2 that implements a selective look-ahead pre-charging technique in accordance with one embodiment of the present invention.

In other embodiments of the present invention, a selective look-ahead pre-charging technique is used that allows selective pre-charging operations of match line segments to be overlapped with compare operations of preceding row segment(s), which in turn may significantly reduce the delay between compare operations of adjacent row segments while still realizing reduced power consumption achieved by selective match line segment pre-charging. FIG. 10A shows a row 100 that is one such embodiment of a row in array 24 of CAM architecture 20 of FIG. 2. Row 100 is shown to include four row segments 24a–24d each having any suitable number of CAM cells coupled to a corresponding match line segment (CAM cells and match line segments are not shown in FIG. 10A for simplicity). In actual embodiments, row 100 may include any suitable number of row segments 24. The CAM cells may be any suitable type of CAM cell including, for example, binary and ternary CAM cells.

In some embodiments, match conditions in at least one odd row segment are used to selectively pre-charge match line segments in one or more subsequent odd row segments and, similarly, match conditions in at least one even row segment are used to selectively pre-charge match line segments in one or more subsequent even row segments. For example, in the embodiment shown in FIG. 10A, match conditions in first row segment 24a are used to selectively pre-charge the match line segment in third row segment 24c, and match conditions in second row segment 24b are used to selectively pre-charge the match line segment in fourth row segment 24d.

Specifically, during compare operations, a pre-charge signal PC is asserted to pre-charge match line segments within first and second row segments 24a and 24b to enable evaluation of match conditions therein. Comparand data is then provided to and compared with data stored in the first and second row segments 24a and 24b either simultaneously or sequentially in response to the clock signal CLK (or one or more control signals). If there is a match condition in first row segment 24a, a pre-charge signal CH_a is asserted and, in response thereto, the match line segment in third row segment 24c is pre-charged to enable evaluation of match conditions therein. Similarly, if there is a match condition in second row segment 24b, a pre-charge signal CH_b is asserted and, in response thereto, the match line segment in fourth row segment 24d is pre-charged to enable evaluation of match conditions therein. Match conditions are subsequently determined in row segments 24c and 24d sequentially or simultaneously in response to CLK (or one or more control signals), and these match results are reflected on pre-charge signals CH_c and CH_d, respectively. The logic states of signals CH_c and CH_d are then compared by compare logic 101 to determine the state of row match line ML. If there are match conditions in each of row segments 24a–24d, a match condition is indicated on row match line ML.

In embodiments having additional row segments, pre-charge signals CH_c and CH_d may be used to selectively pre-charge match line segments in subsequent row segments (not shown in FIG. 10A). For example, in an embodiment having fifth and sixth row segments, CH_c may be used to selectively pre-charge the match line segment in the fifth row segment, and CH_d may be used to selectively pre-charge the match line segment in the sixth row segment, or any combination of subsequent row segments. For another embodiment, pre-charge signals CH_a and CH_b may be used to selectively pre-charge match line segments in the fifth and/or sixth row segments, or any combination of subsequent row segments. Further, match conditions in the fifth and sixth row segments may be used to selectively pre-charge match line segments in seventh and eight row segments, respectively, and so on. The pre-charge or match signals from the final two row segments may then be compared by compare logic 101 to determine the state of ML.

If there is a mismatch condition in first row segment 24a, the match line segment in third row segment 24c is not pre-charged, and if there is a mismatch condition in second row segment 24b, the match line segment in fourth row segment 24d is not pre-charged. Further, if there is a mismatch condition in any row segment 24a–24d, a mismatch condition is indicated on row match line ML. In this manner, a mismatch condition may be indicated for row 100 without pre-charging all match line segments, thereby reducing power consumption associated with pre-charging match line segments.

The pre-charging of the third match line segment (in row segment 24c) may be overlapped with compare operations in the second row segment 24b so that compare operations in the third row segment 24c may be commenced almost immediately after compare operations in second row segment 24b, i.e., without incurring delays associated with pre-charging the third match line segment after a comparison in the first or second row segments. Similarly, the pre-charging of the fourth match line segment (in row segment 24d) may be overlapped with compare operations in the third row segment 24c so that compare operations in the fourth row segment 24d may be commenced almost immediately after compare operations in third row segment 24c, i.e., without incurring delays associated with pre-charging the fourth match line segment after a comparison in the third row segment. In this manner, compare operations for the row may be more efficiently executed to improve performance.

Figure 10B:
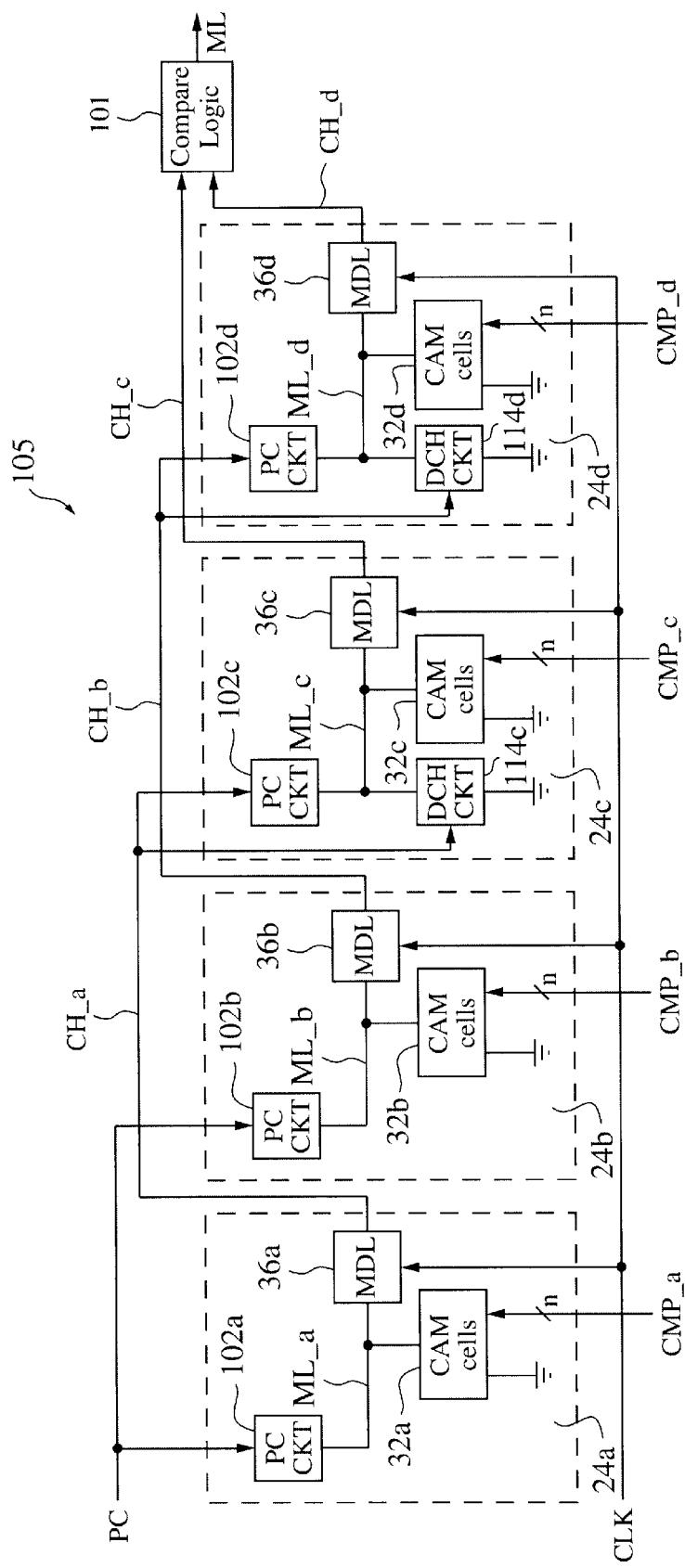
FIG. 10B is a block diagram of the row of FIG. 10A in accordance with one embodiment of the present invention.

FIG. 10B shows a row 105 that is one embodiment of CAM row 100 of FIG. 10A. Row 105 includes the four row segments 24a–24d, although in other embodiments, row 105 may include any suitable number of row segments 24. Each row segment 24a–24d includes a block of respective n CAM cells 32a–32d each coupled to a corresponding match line segment ML_a to ML_d and each receiving a respective block of n bits of comparand data CMP_a to CMP_d. In one embodiment, CAM cell blocks 32a–32d each include 72 CAM cells. Further, each row segment 24a–24d includes a respective pre-charge circuit 102a–102d and respective match detect logic (MDL) 36a–36d. In synchronous embodiments, each match detect logic 36a–36d includes a clock input terminal to receive CLK. In asynchronous embodiments, CLK may not be included.

Pre-charge circuits 102a and 102b pre-charge corresponding match line segments ML_a and ML_b in row segments 24a and 24b, respectively, in response to a pre-charge signal PC. In some embodiments, pre-charge signal PC is maintained in a logic high state, for example, by a connection to $V_{DD}$, so that pre-charge circuits 102a and 102b always charge respective match line segments ML_a and ML_b. In other embodiments, pre-charge signal PC is a pulse generated, for example, by instruction decoder 22 (see also FIG. 2). In one embodiment, pre-charge circuits 102a and 102b receive separate pre-charge signals, e.g., PC(1) and PC(2). In some embodiments, pre-charge circuits 102a–102d may each receive additional control signals such as, for example, enable and/or clock signals.

Match detect logic 36a evaluates match conditions in first row segment 24a and, in response thereto, generates pre-charge signal CH_a, which in turn is provided to pre-charge circuit 102c to selectively pre-charge third match line segment ML_c if CMP_a matches data stored in CAM cells 32a. Match detect logic 36b evaluates match conditions in second row segment 24b and, in response thereto, generates pre-charge signal CH_b, which in turn is provided to pre-charge circuit 102d to selectively pre-charge fourth match line segment ML_d if CMP_b matches data stored in CAM cells 32b. Match detect logic 36c evaluates match conditions in third row segment 24c, and in response thereto, generates pre-charge signal CH_c. Match detect logic 36d evaluates match conditions in fourth row segment 24d and, in response thereto, generates pre-charge signal CH_d.

A discharge circuit 114c responsive to CH_a is coupled between third match line segment ML_c and ground potential, and a discharge circuit 114d responsive to CH_b is coupled between fourth match line segment ML_d and ground potential. In one embodiment, discharge circuits 114c and 114d are pull-down transistors. Word line(s) and bit line(s) have been omitted from FIG. 10B for simplicity. In other embodiments, discharge circuits 114c and 114d may be responsive to CH_b and CH_c, respectively.

For one embodiment, match detect logic 36a–36d are latches or registers that receive the corresponding match line segment signal at its input and clocks out the corresponding CH signal at its output in response to CLK. For other asynchronous embodiments, match detect logic 36a–36d are one or more inverting or non-inverting buffers, or may be omitted altogether.

If all pre-charge signals CH_a through CH_d indicate a match, compare logic 101 will drive row match line ML to a match state. For one embodiment, compare logic 101 is an AND gate. If, however, there is a mismatch condition for any of the row segments, as indicated on one or more of the pre-charge signals CH_a to CH_d, then compare logic 101 will drive row match line ML to a mismatch state.

For example, if there is a mismatch condition in first row segment 24a, one or more corresponding CAM cells 32a discharge or pull match line segment ML_a low toward ground potential. Match detect logic 36a latches the low logic state on ML_a and, in response thereto, de-asserts CH_a (e.g., to logic low). In response to the mismatch condition in first row segment 24a, as indicated by the de-asserted state of CH_a, pre-charge circuit 102c does not pre-charge third match line segment ML_c, thereby disabling ML_c from indicating a match. Additionally, CH_a is provided to discharge circuit 114c to discharge third match line segment ML_c to a mismatch state when CH_a is logic low. The discharged state of third match line segment ML_c, whether in response to mismatch conditions in first row segment 24a or third row segment 24c, is latched into match detect logic 36c which, in response thereto, de-asserts CH_c (e.g., to logic low). This, in turn, will cause compare logic 101 to set row match line ML to a mismatch state.

CH_b is discharged to a mismatch state by one or more CAM cells 32b if match detect logic 36b detects a mismatch condition in second row segment 24b as indicated by the logic state on second match line segment ML_b. In response to the de-asserted state of CH_b, pre-charge circuit 102d does not pre-charge fourth match line segment ML_d, thereby disabling ML_d from indicating a match. Additionally, CH_b is provided to discharge circuit 114d to discharge fourth match line segment ML_d to a mismatch state when CH_b is logic low. The discharged state of fourth match line segment ML_d, whether in response to mismatch conditions in second row segment 24b or fourth row segment 24d, is latched into match detect logic 36d which, in response thereto, de-asserts CH_d (e.g., to logic low). This, in turn, will cause compare logic 101 to set row match line ML to a mismatch state.

The embodiment of FIG. 10B improves performance in a pipelined operation by using match results in early row segments in a look-ahead manner to selectively pre-charge match line segments in later row segments. In this manner, the pre-charging of subsequent row segment(s) may be overlapped with compare operations of previous row segment(s) to improve pipeline efficiency. For example, by pre-charging third match line segment ML_c in response to match conditions in first row segment 24a, the pre-charging of third match line segment ML_c may be overlapped with compare operations within second row segment 24b, which in turn allows compare operations in third row segment 24c to be commenced almost immediately after compare operations in second row segment 24b. Similarly, by pre-charging fourth match line segment ML_d in response to match conditions in second row segment 24b, the pre-charging of fourth match line segment ML_d may be overlapped with compare operations within third row segment 24c, which in turn allows compare operations in fourth row segment 24d to be commenced almost immediately after compare operations in third row segment 24c.

Row 105 may operate asynchronously without CLK or operate in a synchronous or pipelined manner using CLK. For example, the synchronous mode of operation is illustrated, in one embodiment, in the qualitative timing diagram of FIG. 10C.

In cycle 1, pre-charge signal PC is in an asserted state (e.g., logic high) and causes pre-charge circuits 102a and 102b to pre-charge first and second match line segments ML_a and ML_b, respectively, toward $V_{DD}$. In some embodiments, pre-charge signal PC may be omitted.

In cycle 2, the first n-bits of a first comparand data (CMP1_a) are loaded into and compared with data stored in corresponding CAM cells 32a of first row segment 24a. The comparison results for first row segment 24a are indicated by the logic state of ML_a.

By cycle 3, match detect logic 36a generates CH_a in response to ML_a. If there is a match condition in first row segment 24a, CH_a is asserted (e.g., to logic high) to cause pre-charge circuit 102c to pre-charge third match line segment ML_c toward $V_{DD}$. The asserted state of CH_a also causes discharge circuit 114c to turn off and not discharge ML_c. If there is a mismatch condition in first row segment 24a, CH_a is de-asserted (e.g., to logic low) to cause pre-charge circuit 102c to not pre-charge third match line segment ML_c. The de-asserted state of CH_a also causes discharge circuit 114c to turn on and discharge third match line segment ML_c. During cycle 3, the second n-bits of first comparand data (CMP1_b) are loaded into and compared with data stored in corresponding CAM cells 32b of second row segment 24b. The comparison results for second row segment 24b are indicated by the logic state of ML_b.

By cycle 5, match detect logic 36b generates CH_b in response to ML_b. If there is a match condition in second row segment 24b, CH_b is asserted (e.g., to logic high) to cause pre-charge circuit 102d to pre-charge fourth match line segment ML_d toward $V_{DD}$. The asserted state of CH_b also causes discharge circuit 114d to turn off and not discharge ML_d. If there is a mismatch condition in second row segment 24b, CH_b is de-asserted (e.g., to logic low) and causes pre-charge circuit 102d to not pre-charge fourth match line segment ML_d. The de-asserted state of CH_b also causes discharge circuit 114d to turn on and discharge ML_d. During cycle 4, the third n-bits of first comparand data (CMP_c) are loaded into and compared with data stored in corresponding CAM cells 32c of third row segment 24c. The comparison results for third row segment 24c are indicated by the logic state of ML_c.

By cycle 4, match detect logic 36c generates CH_c in response to ML_c. If there is a match condition in third row segment 24c, CH_c is asserted (e.g., to logic high). If there is a mismatch condition in third row segment 24c, CH_c is deasserted (e.g., to logic low). During cycle 5, the fourth n-bits of comparand data (CMP_d) are loaded into and compared with data stored in corresponding CAM cells 32d of fourth row segment 24d. The comparison results for fourth row segment 24d are indicated by the logic state of ML_d.

By cycle 6, match detect logic 36d generates CH_d in response to ML_d. If there is a match condition in fourth row segment 24d, CH_d is asserted (e.g., to logic high). If both CH_c and CH_d are asserted, compare logic 101 asserts row match line ML to a match state. Conversely, if either CH_c or CH_d is de-asserted, compare logic 101 de-asserts row match line ML to a mismatch state.

Figure 10C:
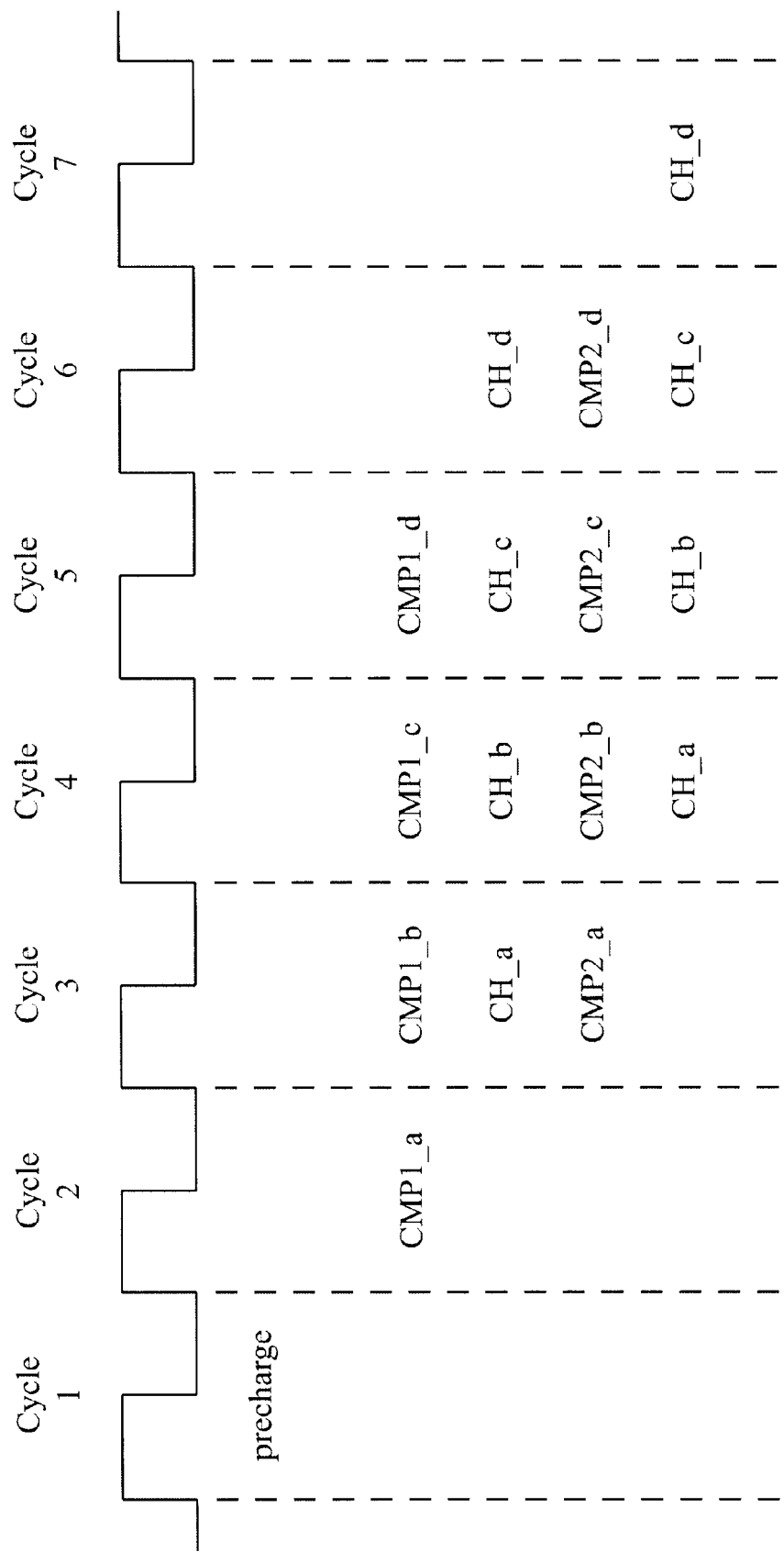
FIG. 10C is a qualitative timing diagram illustrating compare operations in one embodiment of the CAM row of FIG. 10B.

A subsequent compare operation may be overlapped or pipelined with the first compare operation, as also illustrated in FIG. 10C. For example, in cycle 3, the first n-bits of a second comparand word (CMP2_a) are loaded into and compared with data stored in corresponding CAM cells 32a of first row segment 24a.

By cycle 4, match detect logic 36a generates CH_a in response to the comparison results in first row segment 24a. CH_a is used to control pre-charge circuit 102c and discharge circuit 114c as described above. During cycle 4, the second n-bits of the second comparand word (CMP2_b) are loaded into and compared with data stored in corresponding CAM cells 32b of second row segment 24b.

By cycle 5, match detect logic 36b generates CH_b in response to the comparison results in second row segment 24b. CH_b is used to control pre-charge circuit 102d and discharge circuit 114d as described above. During cycle 5, the third n-bits of the second comparand word (CMP2_c) are loaded into and compared with data stored in corresponding CAM cells 32c of third row segment 24c.

By cycle 6, match detect logic 36c generates CH_c in response to the comparison results in third row segment 24c. During cycle 6, the fourth n-bits of the second comparand word (CMP2_d) are loaded into and compared with data stored in corresponding CAM cells 32d of fourth row segment 24d.

By cycle 7, match detect logic 36d generates CH_d in response to the comparison results in fourth row segment 24d. If both CH_c and CH_d are asserted, compare logic 101 asserts row match line ML to a match state. Conversely, if either CH_c or CH_d is de-asserted, compare logic 101 de-asserts row match line ML to a mismatch state.

Figure 11A:
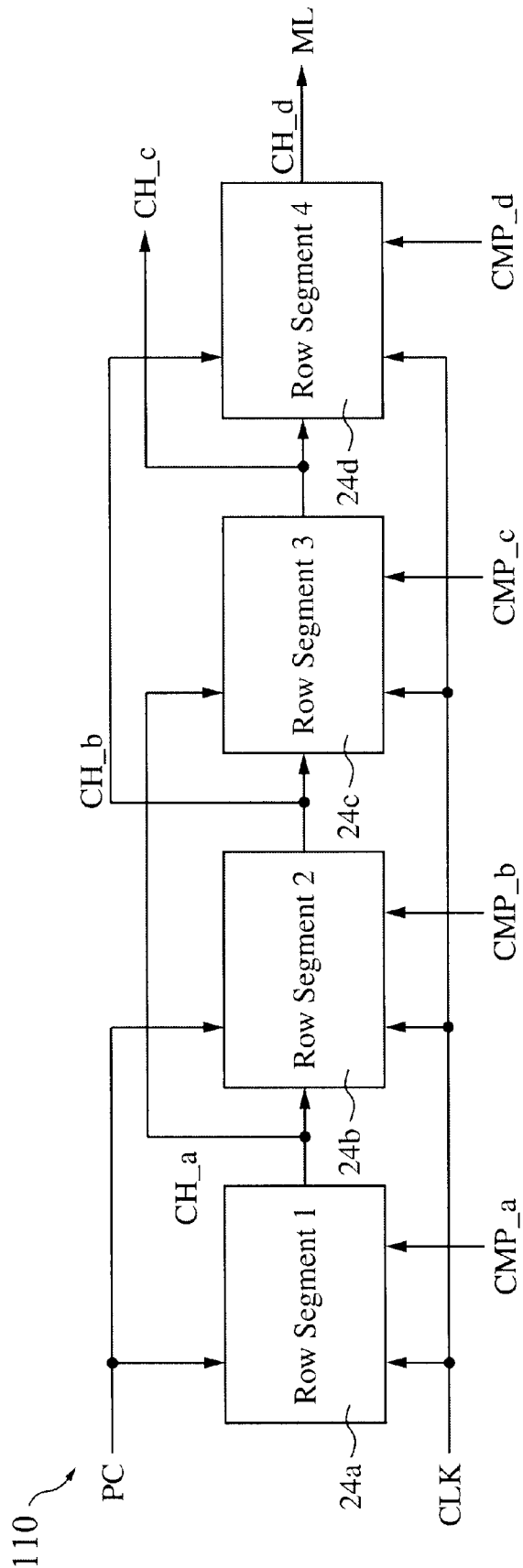
FIG. 11A is a block diagram of a row of the CAM architecture of FIG. 2 that implements a selective look-ahead pre-charging technique in accordance with another embodiment of the present invention.

FIG. 11A shows a row 110 that is another embodiment of a row in array 24 of CAM architecture 20 of FIG. 2. Row 110 includes the four row segments 24a–24d of CAM cells described above, and is similar in operation to row 100 of FIG. 10A. For example, pre-charge signal CH_a is asserted in response to match conditions in first row segment 24a to selectively pre-charge the match line segment in third row segment 24c, and pre-charge signal CH_b is asserted in response to match conditions in second row segment 24b to selectively pre-charge the match line segment in fourth row segment 24d, as described above with respect to FIGS. 10A–10C.

In addition, the pre-charge signal CH generated in each row segment of row 110 is provided to the next row segment to enable or disable the evaluation of match conditions therein. Thus, for example, CH_a is provided to second row segment 24b to enable or disable evaluation of match conditions therein, CH_b is provided to third row segment 24c to enable or disable evaluation of match conditions therein, and CH_c is provided to fourth row segment 24d to enable or disable evaluation of match conditions therein. CH_d indicates match conditions for row 110 on row match line ML, and thus the compare logic 101 of FIGS. 10A and 10B is not necessary.

In embodiments having additional row segments, pre-charge signals CH_c and CH_d may be used to selectively pre-charge match line segments in subsequent row segments and/or enable or disable evaluation of match conditions therein (subsequent row segments not shown in FIG. 11A). For example, in an embodiment having fifth and sixth row segments, pre-charge signal CH_c may be used to selectively pre-charge match line segments in the fifth row segment, and pre-charge signal CH_d may be used to selectively pre-charge match line segments in the sixth row segment, or any combination of subsequent row segments, and so on. In such embodiments, pre-charge signal CH_d may be provided to the fifth row segment to enable or disable evaluation of match conditions therein, pre-charge signal CH_e (generated in response to match conditions in the fifth row segment) may be provided to the sixth row segment to enable or disable evaluation of match conditions therein, and pre-charge signal CH_f (generated in response to match conditions in the sixth row segment) indicates match conditions for row 110 on row match line ML. For another embodiment, pre-charge signals CH_a and CH_b may be used to selectively pre-charge the fifth and/or sixth row segments, or any combination of subsequent row segments.

Figure 11B:
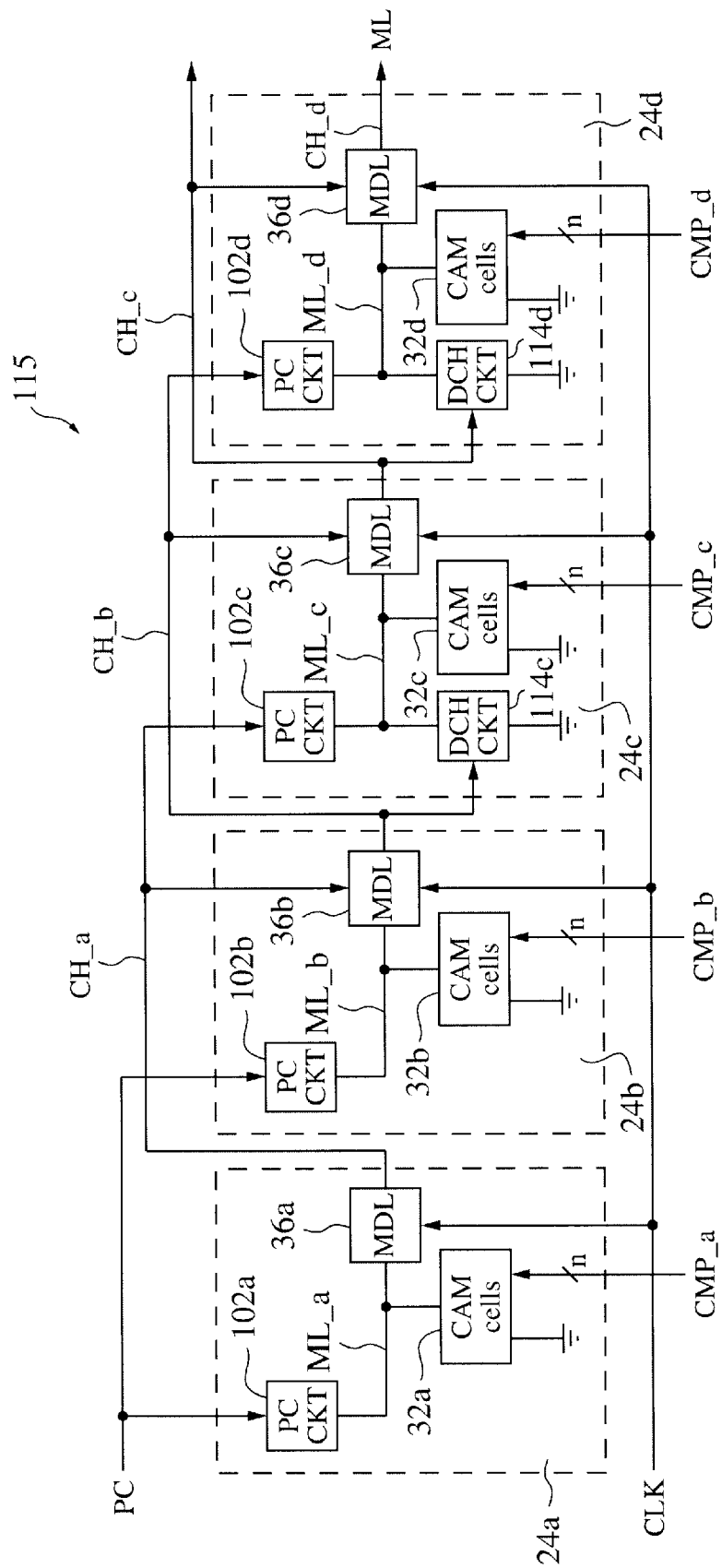
FIG. 11B is a block diagram of the row of FIG. 11A in accordance with one embodiment of the present invention.

FIG. 11B shows a row 115 that is one embodiment of CAM row 110 of FIG. 11A. Row 115 includes the four row segments 24a–24d described above with respect to FIG. 10B, although in other embodiments, row 115 may include any suitable number of row segments 24. Row 115 is similar in configuration and operation to row 105 of FIG. 10B, except that the match detect logic 36 of each row segment 24a–24d includes an additional input to receive a pre-charge signal CH generated in the previous row segment. Specifically, pre-charge signal CH_a is provided to match detect logic 36b of second row segment 24b, pre-charge signal CH_b is provided to match detect logic 36c of third row segment 24c, and pre-charge signal CH_c is provided to match detect logic 36d of fourth row segment 24d. In this manner, each pre-charge signal CH is indicative of match conditions its own row segment as well as all previous row segments.

For example, match detect logic 36b combines CH_a and ML_b to generate CH_b, which is indicative of match conditions in both first and second row segments 24a and 24b. Similarly, match detect logic 36c combines CH_b and ML_c to generate CH_c, which is indicative of match conditions in first through third row segments 24a–24c. Match detect logic 36d combines CH_c and ML_d to generate CH_d, which is indicative of match conditions in first through fourth row segments 24a–24d, and thus for match conditions for the entire row 110.

In operation, pre-charge circuits 102a and 102b pre-charge corresponding match line segments ML_a and ML_b in row segments 24a and 24b, respectively, in response to pre-charge signal PC being asserted to logic high. The first n-bits of the comparand word CMP_a are compared with data stored in corresponding CAM cells 32a. If there is a match, match detect logic 36a asserts CH_a to logic high. The asserted CH_a is latched into match detect logic 36b in second row segment 24b, and provided to pre-charge circuit 102c to pre-charge third match line segment ML_c. If there is a mismatch, CH_a is de-asserted to logic low, which in turn forces CH_b to logic low via match detect logic 36b, irrespective of match conditions in second row segment 24b, and also causes pre-charge circuit 102c to not pre-charge ML_c.

The second n-bits of the comparand word CMP_b are compared with data stored in corresponding CAM cells 32b. If there is a match, and if CH_a is asserted, match detect logic 36b asserts CH_b to logic high. The asserted CH_b is latched into match detect logic 36c in third row segment 24c, and provided to pre-charge circuit 102d to pre-charge fourth match line segment ML_d. If there is a mismatch, or if CH_a is de-asserted, match detect logic 36b de-asserts CH_b to logic low. The de-asserted CH_b forces CH_c to logic low via match detect logic 36c, irrespective of match conditions in third row segment 24c, and also causes pre-charge circuit 102d to not pre-charge ML_d. The de-asserted CH_b also causes discharge circuit 114c to discharge ML_c.

The third n-bits of the comparand word CMP_c are compared with data stored in corresponding CAM cells 32c. If there is a match, and if CH_b is asserted, match detect logic 36c asserts CH_c to logic high. The asserted CH_c is latched into match detect logic 36d in fourth row segment 24d. If there is a mismatch, or if CH_b is de-asserted, match detect logic 36c de-asserts CH_c to logic low. The de-asserted CH_c forces CH_d to logic low via match detect logic 36d, irrespective of match conditions in fourth row segment 24c, and thus also forces a mismatch condition for row 115 on row match line ML. The de-asserted CH_c also causes discharge circuit 114d to discharge ML_d.

The fourth n-bits of the comparand word CMP_d are compared with data stored in corresponding CAM cells 32d. If there is a match, and if CH_c is asserted, match detect logic 36d asserts CH_d (and thus ML) to logic high. If there is a mismatch, or if CH_c is de-asserted, match detect logic 36d de-asserts CH_d and thus ML to logic low to indicate the mismatch condition.

Thus, if there is a mismatch condition in any row segment 24a–24d, a mismatch condition is indicated by the corresponding pre-charge signal CH and thereafter rippled through row segments 24a–24d to ML. In this manner, compare logic 101 of FIGS. 10A and 10B is not necessary for row 115, thereby saving silicon area.

The loading of comparand data into and subsequent comparison with data stored in corresponding row segments 24a–24d of row 115 may be synchronous or asynchronous, and may be overlapped or pipelined as described above with respect to row 105 of FIG. 10B and the qualitative timing diagram of FIG. 10C to improve performance.

The embodiments described above with respect to FIGS. 10A–10C and 11A–11B may be used as CAM rows in any suitable CAM architecture. In some embodiments, the CAM rows of FIGS. 10A–10C and 11A–11B may be used within composite row segments 52a and 52b of embodiments of FIG. 6.

Match detect logic 36a may be a latch or register that receives PC and clocks out CH_a at its output in response to CLK. For other asynchronous embodiments, match detect logic 36a may be one or more inverting or non-inverting buffers, or may be omitted altogether.

Figure 12:
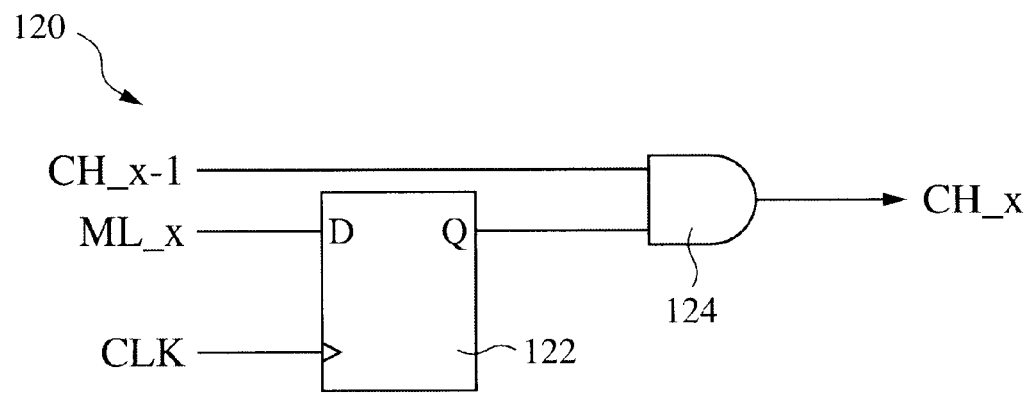
FIG. 12 is a block diagram of match detect logic in one embodiment of the present invention.

FIG. 12 shows a match detect circuit 120 that is one embodiment of match detect logic 36b, 36c, and 36d of row 115. Match detect circuit 120 combines match conditions in an $x^{th}$ row segment 24(x), as indicated by the logic state of corresponding match line segment ML_x, with match conditions in previous row segments, as indicated by the pre-charge signal CH_x−1 from the previous row segment 24(x−1). Match detect circuit 120 includes a latch 122 and an AND gate 124. Latch 122, which may be, for example, a D-type flip-flop, has an input coupled to ML_x, a clock input to receive a clock signal CLK, and an output terminal coupled to a first input of AND gate 124. AND gate 124 includes a second input to receive CH_x−1, and an output to generate pre-charge signal CH_x, which in turn may be provided to a subsequent row segment(s).

When CLK is logic high, latch 122 latches the logic state on match line segment ML_x. The resulting output signal Q of latch 122 is combined in AND gate 124 with CH_x−1 to generate CH_x. Thus, if there is a match condition in the previous row segment 24(x−1), as indicated by CH_x−1, and there is a match condition in row segment 24(x), as indicated by ML_x, AND gate 124 asserts CH_x to logic high to indicate the match condition. Otherwise, if there is a mismatch condition in either row segment 24(x−1) or 24(x), AND gate 124 de-asserts CH_x to logic low to indicate the mismatch condition.

Figure 13:
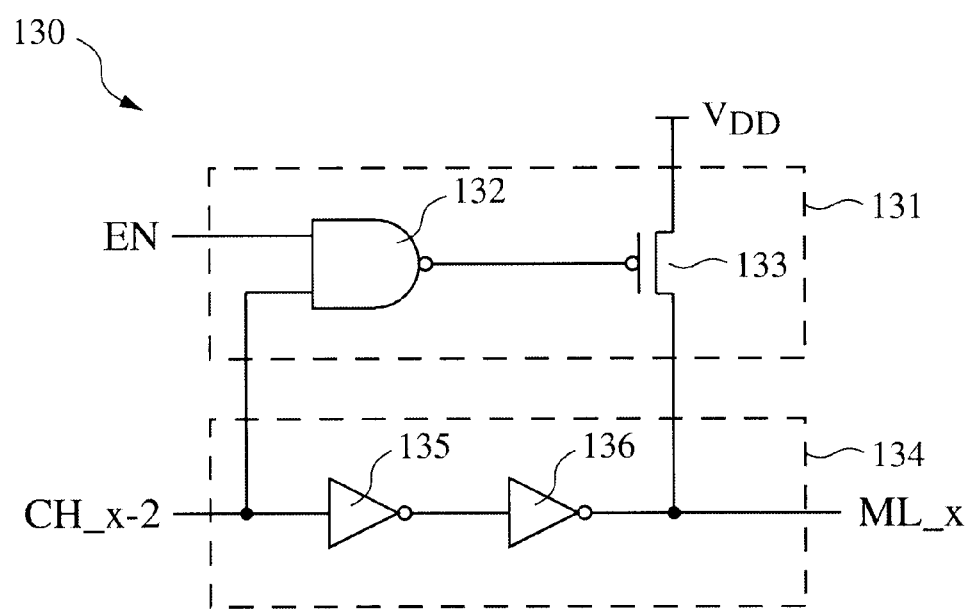
FIG. 13 is a block diagram of a pre-charge circuit in one embodiment of the present invention.

FIG. 13 shows a pre-charge circuit 130 that is one embodiment of the pre-charge circuits 102 of FIGS. 10A–10B and 11A–11B. Pre-charge circuit 130 pre-charges the match line segment ML_x in an $x^{th}$ row segment 24(x) in response to match conditions in the $(x-2)^{th}$ row segment 24(x−2). Other pre-charge circuits may be used, including, for example, the pre-charge circuit of FIG. 8. Pre-charge circuit 130 includes an AC pre-charge circuit 131 and a DC pre-charge circuit 134. AC pre-charge circuit 131 includes a NAND gate 132 and a PMOS pull-up transistor 133. NAND gate 132 includes a first input terminal coupled to receive an enable signal EN, a second input terminal coupled to receive pre-charge signal CH_x−2 from row segment 24(x−2), and an output terminal coupled to the gate of PMOS transistor 133, which is coupled between $V_{DD}$ and match line segment ML_x. When EN is asserted to logic high, PMOS pull-up transistor 133 turns on and charges ML_x toward $V_{DD}$ if CH_x−2 indicates a match condition in row segment 24(x−2), i.e., if CH_x−2 is asserted to logic high. In some embodiments, EN may be a clock signal generated, for example, by instruction decoder 22.

DC pre-charge circuit 134 includes first and second inverting buffers 135 and 136 coupled between signal CH_x−2 and match line segment ML_x. DC pre-charge circuit 134 maintains the pre-charge logic state on ML_x when the relatively strong AC pre-charge circuit 131 has completed its pre-charge operation (i.e., when EN is de-asserted). In some embodiments, inverting buffers 135 and 136 are conventional CMOS inverters coupled between $V_{DD}$ and ground potential. Thus, DC pre-charge circuit 134 pre-charges ML_x when CH_x−2 indicates a match condition for row segment 24(x−2). When pre-charge circuit 130 is used for pre-charge circuits 102*a* and 102*b* in the first two row segment 24*a* and 24*b*, the buffer 135 and the second input terminal of NAND gate 132 are coupled to receive pre-charge signal PC. For alternative embodiments, DC pre-charge circuit 134 may be omitted.

Figure 14:
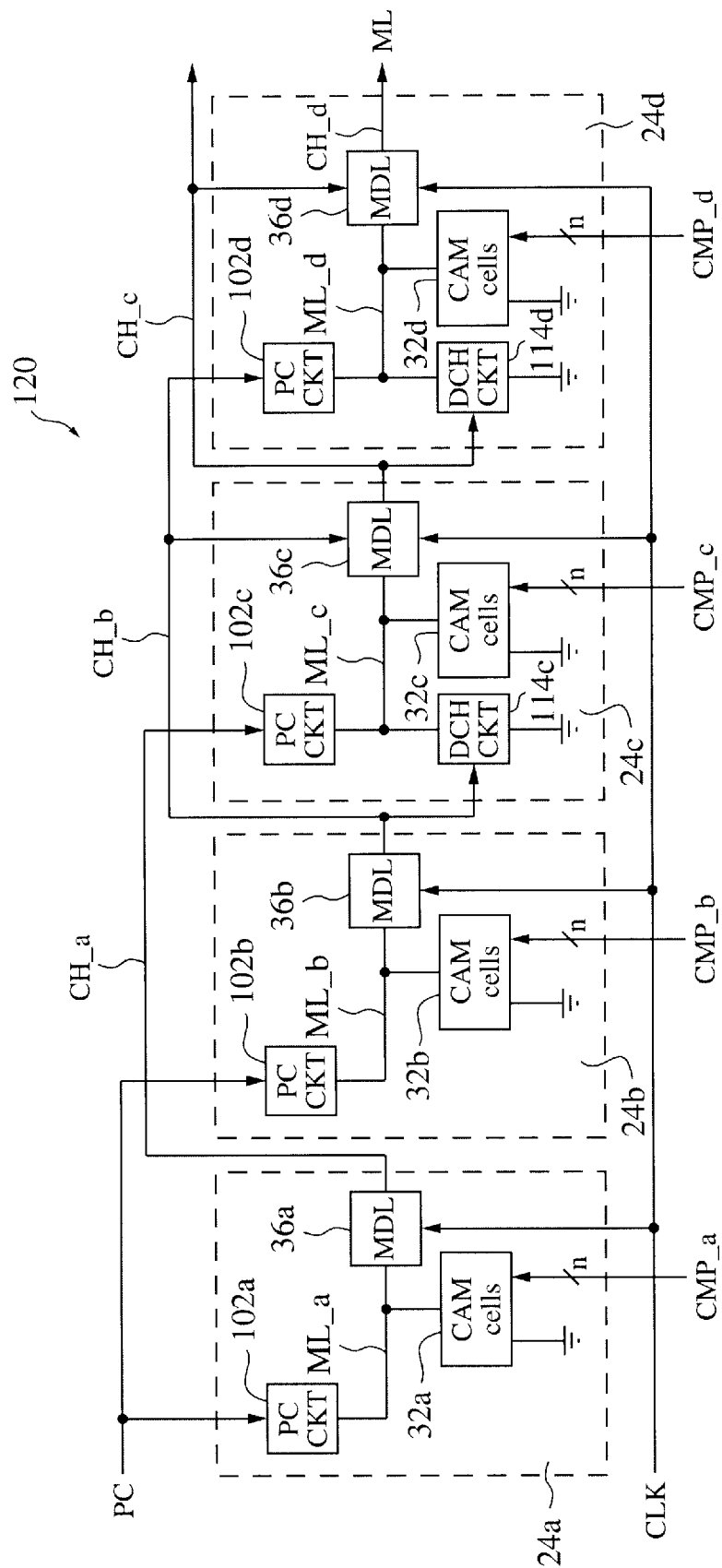
FIG. 14 is a block diagram of a row of the CAM architecture of FIG. 2 that implements a selective look-ahead pre-charging technique in accordance with yet another embodiment of the present invention.

For another embodiment, CMP_a and CMP_b may be provided to CAM row 100 or 110 together, and CMP_C and CMP_d may be provided to CAM row 100 or 110 together. In such embodiments, where two blocks of comparand data CMP_x and CMP_x+1 are simultaneously provided to and compared with data stored in corresponding CAM cell blocks 32x and 32(x+1), e.g., where the comparand bus CBUS is 2n bits wide, pre-charge signal CH_a is not provided to match detect logic 36*b*, as shown in FIG. 14, so that the selective pre-charging of fourth match line segment ML_d is not delayed by the rippling of match conditions from first row segment 24*a* to match detect logic 36*b*.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) array including a plurality of rows, each of the rows having at least first, second, and third adjacent row segments, each of the row segments comprising a plurality of CAM cells coupled to a match line segment, and wherein the third row segment includes means for selectively pre-charging its match line segment in response to match conditions in the first row segment.

2. The CAM array of claim 1, wherein the means for selectively pre-charging the third match line segment selectively pre-charges the third match line segment in response to match conditions in both the first and second row segments.

3. The CAM array of claim 1, further comprising a fourth row segment comprising a plurality of CAM cells coupled to a fourth match line segment, and wherein the fourth row segment includes means for selectively pre-charging the fourth match line segment in response to match conditions in the second row segment.

4. The CAM array of claim 3, wherein the means for selectively pre-charging the fourth match line segment selectively pre-charges the fourth match line segment in response to match conditions in both the first and second row segments.

5. The CAM array of claim 1, wherein the third row segment further comprises means for discharging the third match line segment in response to match conditions in the first row segment.

6. The CAM array of claim 4, wherein the fourth row segment further comprises means for discharging the fourth match line segment in response to match conditions in the second row segment.

7. A content addressable memory (CAM) array including a plurality of rows, each of the rows having at least first, second, and third sequentially adjacent row segments, each of the row segments comprising:

a plurality of CAM cells coupled to a match line segment;

a pre-charge circuit coupled to the match line segment; and match detect logic coupled to the match line segment,
wherein the match detect logic in the first row segment is coupled to the pre-charge circuit in the third row segment.

8. The CAM array of claim 7, wherein the pre-charge circuit in the third row segment selectively pre-charges the third match line segment in response to match conditions in the first row segment.

9. The CAM array of claim 7, wherein the match detect logic in the second row segment is coupled to a pre-charge circuit in a fourth row segment.

10. The CAM array of claim 9, wherein the pre-charge circuit in the fourth row segment selectively pre-charges the fourth match line segment in response to match conditions in the second row segment.

11. The CAM array of claim 7, wherein the match detect logic in the first row segment comprises a latch.

12. The CAM array of claim 7, wherein the match detect logic in the second row segment comprises:

a latch having an input terminal coupled to the match line segment of the second row segment, and an output terminal; and a logic gate having a first input terminal coupled to the output terminal of the latch, a second input terminal coupled to the match detect logic of the first row segment, and an output terminal coupled to a pre-charge circuit of a fourth row segment.

13. The CAM array of claim 7, wherein the pre-charge circuit comprises:

a pull-up transistor coupled between the match line segment and a supply voltage, and having a gate;

a logic AND gate having a first input terminal to receive a pre-charge signal, a second input terminal to receive an enable signal, and an output terminal coupled to the gate of the pull-up transistor; and one or more buffers coupled between the pre-charge signal and the match line segment.

14. The CAM array of claim 7, wherein the pre-charge circuit comprises:

a pull-up transistor coupled between the match line segment and a supply voltage, and having a gate; and a logic gate having a first input terminal coupled to receive a pre-charge signal, a second input terminal coupled to receive an enable signal, and an output terminal coupled to the gate of the pull-up transistor.

15. The CAM array of claim 7, wherein the third row segment further comprises a discharge circuit coupled to the third match line segment and the match detect logic of a preceding row segment.

16. The CAM array of claim 15, wherein the discharge circuit selectively discharges the third match line segment in response to a mismatch condition in the preceding row segment.

17. The CAM array of claim 16, wherein the discharge circuit comprises a pull-down transistor.

18. The CAM array of claim 9, further comprising a compare circuit coupled to the third and fourth match line segments, the compare circuit for generating a signal indicative of match conditions in the row.

19. A method for selectively enabling row segments of a content addressable memory (CAM) array having at least first, second, and third adjacent row segments, each row segment including a number of CAM cells coupled to a match line segment, the method comprising:

evaluating match conditions in the first and second row segments; and selectively pre-charging the match line segment in the third row segment to enable detection of match conditions therein in response to the match conditions in the first row segment.

20. The method of claim 19, wherein evaluating match conditions in the first row segment comprises determining the logic state of the match line segment therein.

21. The method of claim 19, further comprising:

selectively pre-charging a match line segment in a fourth row segment to enable detection of match conditions therein in response to match conditions in the second row segment.

22. The method of claim 19, further comprising simultaneously pre-charging the match line segments in the first and second row segments to enable detection of match conditions therein.

23. The method of claim 19, wherein the match line segment in the third row segment is selectively pre-charged in response to match conditions in the first and second row segments.

24. The method of claim 19, further comprising:

selectively discharging the match line segment in the third row segment in response match conditions in the second row segment.

25. The method of claim 21, further comprising:

selectively discharging the match line segment in the fourth row segment in response match conditions in the third row segment.

26. The method of claim 19, wherein blocks of comparand data are sequentially loaded into and compared with data stored in corresponding row segments in a pipelined manner.

* * * * *